US012795818B2

(12) United States Patent
Arnold et al.

(10) Patent No.: US 12,795,818 B2
(45) Date of Patent: Nov. 10, 2026

(54) DAMPING STRUCTURE

(71) Applicant: Apple Inc., Cupertino, CA (US)

(72) Inventors: Shawn X. Arnold, Cupertino, CA (US); Zhongqing Gong, Fremont, CA (US); Anping Guo, San Jose, CA (US)

(73) Assignee: APPLE INC., Cupertino, CA (US)

( * ) Notice: Subject to any disclaimer, the term of this patent is extended or adjusted under 35 U.S.C. 154(b) by 176 days.

(21) Appl. No.: 18/781,453

(22) Filed: Jul. 23, 2024

(65) Prior Publication Data

US 2025/0071888 A1 Feb. 27, 2025

Related U.S. Application Data

(60) Provisional application No. 63/578,704, filed on Aug. 25, 2023.

(51) Int. Cl.
*H05K 1/02* (2006.01)
*H05K 1/11* (2006.01)

(52) U.S. Cl.
CPC ......... *H05K 1/0271* (2013.01); *H05K 1/0213* (2013.01); *H05K 1/111* (2013.01); *H05K 2201/2045* (2013.01)

(58) Field of Classification Search
CPC .... H05K 1/0271; H05K 1/0213; H05K 1/111; H05K 2201/2045
See application file for complete search history.

(56) References Cited

U.S. PATENT DOCUMENTS

| | | | |
|---|---|---|---|
| 9,686,855 | B2 | 6/2017 | Ishikawa et al. |
| 10,448,502 | B2 | 10/2019 | Kim et al. |
| 10,510,489 | B2 | 12/2019 | Yamada et al. |

FOREIGN PATENT DOCUMENTS

| | | |
|---|---|---|
| CN | 214751627 U | 11/2021 |
| KR | 102189803 B1 | 12/2020 |

*Primary Examiner* — Jeremy C Norris

(74) *Attorney, Agent, or Firm* — Sterne, Kessler, Goldstein & Fox P.L.L.C.

(57) ABSTRACT

The present disclosure describes a structure with a substrate, a damping structure, and a capacitor structure. The damping structure is disposed over the substrate and includes a rigid material layer and a damping material layer disposed on the rigid material layer. The damping material layer includes a damping material with a tensile strength of about 20 MPa, a Young's modulus of about 0.5 GPa, and an elongation of about 10%. The capacitor structure is disposed over the damping structure, in which the damping structure mitigates (or eliminates) a transfer of piezoelectric and electrostrictive vibrations generated by the capacitor structure to the substrate.

36 Claims, 25 Drawing Sheets

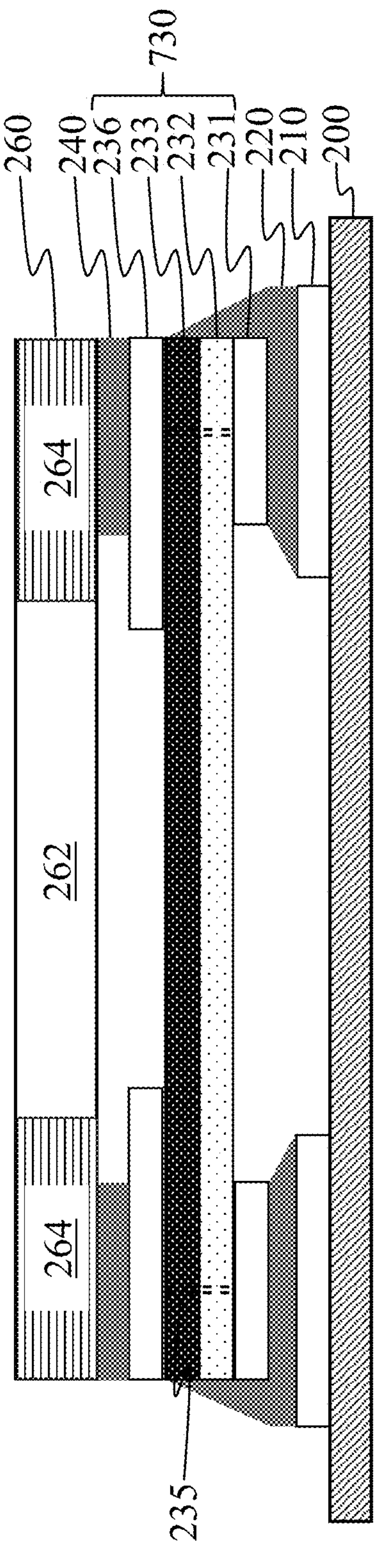
Figure 20
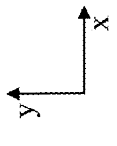

DAMPING STRUCTURE

CROSS REFERENCE TO RELATED APPLICATION

This application claims the benefit of U.S. Provisional Application No. 63/578,704, filed Aug. 25, 2023 and titled "Damping Structure," which incorporated by reference herein in its entirety.

FIELD

This disclosure relates to a damping structure and, more particularly, to a damping structure for a capacitor disposed on a printed circuit board.

BACKGROUND

Capacitors play a significant role in electronic devices. For example, capacitors can maintain voltages at particular levels, remove undesirable noise, and charge and discharge energy. Capacitors can have a structure with two conducting plates separated by a dielectric material.

One type of capacitor is a ceramic capacitor, with a ceramic material (e.g., barium titanate) as its dielectric material. Due to piezoelectric and electrostrictive effects, the ceramic capacitor can vibrate. And when the ceramic capacitor is disposed on a printed circuit board, the vibration from the ceramic capacitor can be transferred to the printed circuit board, causing an undesirable audible noise.

SUMMARY

Embodiments of the present disclosure include a structure with a substrate, a damping structure, and a capacitor structure. The damping structure is disposed over the substrate and includes a rigid material layer and a damping material layer disposed on the rigid material layer. The damping material layer includes a damping material with a tensile strength of about 20 MPa, a Young's modulus of about 0.5 GPa, and an elongation of about 10%. The capacitor structure is disposed over the damping structure. The damping structure mitigates (or eliminates) a transfer of piezoelectric and electrostrictive vibrations generated by the capacitor structure to the substrate.

Embodiments of the present disclosure include a printed circuit board with first contact pads disposed on an electronic device surface of the printed circuit board, a solder layer disposed on the first contact pads, a damping structure disposed on the solder layer, and a capacitor structure disposed over the damping structure. The damping structure includes second contact pads disposed on the solder layer, a rigid material layer disposed on the second contact pads, and a damping material layer disposed on the rigid material layer. The damping material layer includes a damping material with a tensile strength of about 20 MPa, a Young's modulus of about 0.5 GPa, and an elongation of about 10%. The damping structure mitigates (or eliminates) a transfer of piezoelectric and electrostrictive vibrations generated by the capacitor structure to the printed circuit board.

Embodiments of the present disclosure include a method for placing a capacitor element with a damping structure on a printed circuit board. The method includes disposing a damping structure over a substrate. The damping structure includes a rigid material layer and a damping material layer on the rigid material layer. The damping material layer includes a damping material with a tensile strength of about 20 MPa, a Young's modulus of about 0.5 GPa, and an elongation of about 10%. The method also includes disposing a capacitor structure over the damping structure. The damping material layer mitigates (or eliminates) a transfer of piezoelectric and electrostrictive vibrations generated by the capacitor structure to the substrate.

Embodiments of the present disclosure include another method for placing a capacitor element with a damping structure on a printed circuit board. The method includes disposing an interposer with a damping structure on a substrate. The damping structure includes a rigid material layer and a damping material layer on the rigid material layer. The damping material layer includes a damping material with a tensile strength of about 20 MPa, a Young's modulus of about 0.5 GPa, and an elongation of about 10%. The method also includes placing the substrate with the interposer and damping structure on a printed circuit board. The method further includes disposing, after placing the substrate on the printed circuit board, a capacitor on the interposer with damping structure. The damping material layer mitigates (or eliminates) a transfer of piezoelectric and electrostrictive vibrations generated by the capacitor to the substrate and the printed circuit board.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

FIGS. 19-24 are other intermediate structures during a placement of a capacitor element with a damping structure on a printed circuit board, according to some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
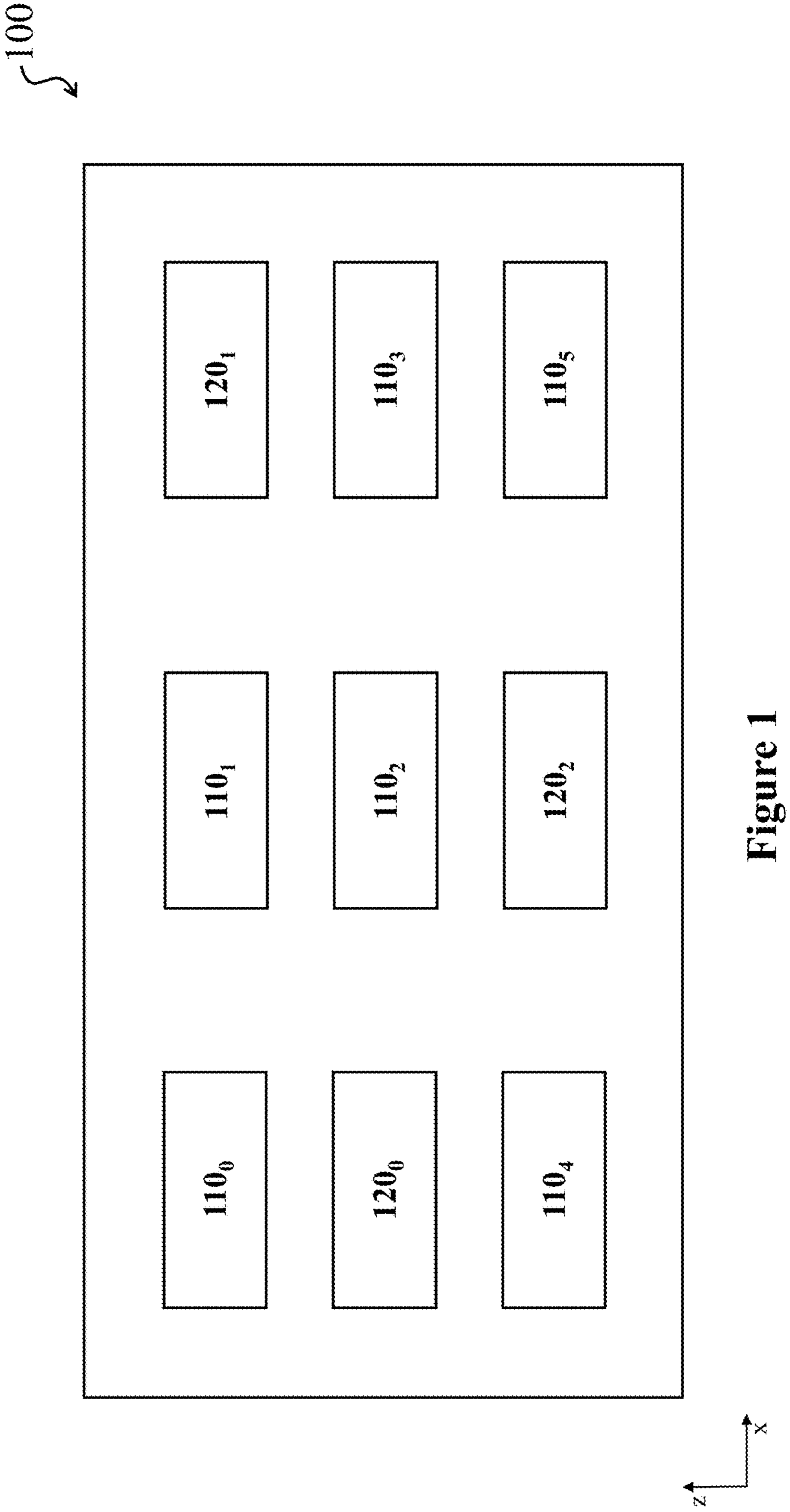
FIG. 1 is an illustration of a printed circuit board, according to some embodiments.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

It is noted that references in the specification to "one embodiment," "an embodiment," "an example embodiment," and "exemplary" indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

It is to be understood that the phraseology or terminology herein is for the purpose of description and not of limitation, such that the terminology or phraseology of the present specification is to be interpreted by those skilled in relevant art(s) in light of the teachings herein.

The following disclosure describes aspects of a damping structure. Specifically, the present disclosure describes a damping structure for a capacitor disposed on a substrate (or printed circuit board). For example, the capacitor can include a ceramic-based dielectric material, such as barium titanate. When an AC voltage is applied to the ceramic-based capacitor, the capacitor can start to vibrate due to piezoelectricity. Also, an electric field generated between electrodes of the ceramic-based capacitor can create an electrostrictive vibration at a level similar to the piezoelectric vibration level. As a result, the capacitor's piezoelectric and electrostrictive vibrations can be transferred to the substrate (or printed circuit board), causing an undesirable resonance in the audible range (e.g., between about 20 Hz and 20 kHz) to be generated by the substrate (or printed circuit board). Embodiments of the damping structure described herein are designed to mitigate (or eliminate) the transfer of the capacitor's piezoelectric and electrostrictive vibrations to the substrate (or printed circuit board)—thus, mitigating (or eliminating) the undesirable audible noise.

FIG. 1 is an illustration of a printed circuit board 100, according to some embodiments. Printed circuit board 100 is a multilayer substrate with conductive trace structures (not shown in FIG. 1) to electrically connect electronics components-such as circuit elements $\mathbf{110_0}$-$\mathbf{110_5}$ and capacitor elements $\mathbf{120_0}$-$\mathbf{120_2}$—to one another. In some embodiments, the substrate of printed circuit board 100 can be in the form of a laminated sandwich structure of conductive layers (which includes conductive trace structures) and insulating layers. In some embodiments, the substrate of printed circuit board 100 is a flame retardant 4 (FR4) printed circuit board. Based on the description herein, other types of suitable substrates can be used for printed circuit board 100.

Circuit elements $\mathbf{110_0}$-$\mathbf{110_5}$ and capacitor elements $\mathbf{120_0}$-$\mathbf{120_2}$ are disposed on an electronic device surface of printed circuit board 100. The electronic device surface can be a surface of printed circuit board 100 in which a surface mount assembly process places circuit elements $\mathbf{110_0}$-$\mathbf{110_5}$ and capacitor elements $\mathbf{120_0}$-$\mathbf{120_2}$ onto printed circuit board 100. The number and arrangement of circuit elements $\mathbf{110_0}$-$\mathbf{110_5}$ and capacitor elements $\mathbf{120_0}$-$\mathbf{120_2}$ shown in FIG. 1 is for example purposes. Embodiments of the present disclosure are applicable to printed circuit board designs with a different number and a different arrangement of circuit elements and capacitor elements.

In some embodiments, circuit elements $\mathbf{110_0}$-$\mathbf{110_5}$ can be active electrical components, passive electrical components, or a combination of both. Examples of active electrical components include integrated circuits, central processing units, graphics processing units, diodes, transistors, voltage sources, current sources, and other suitable types of active devices. Examples of passive electrical components includes resistors and inductors.

Figure 2:
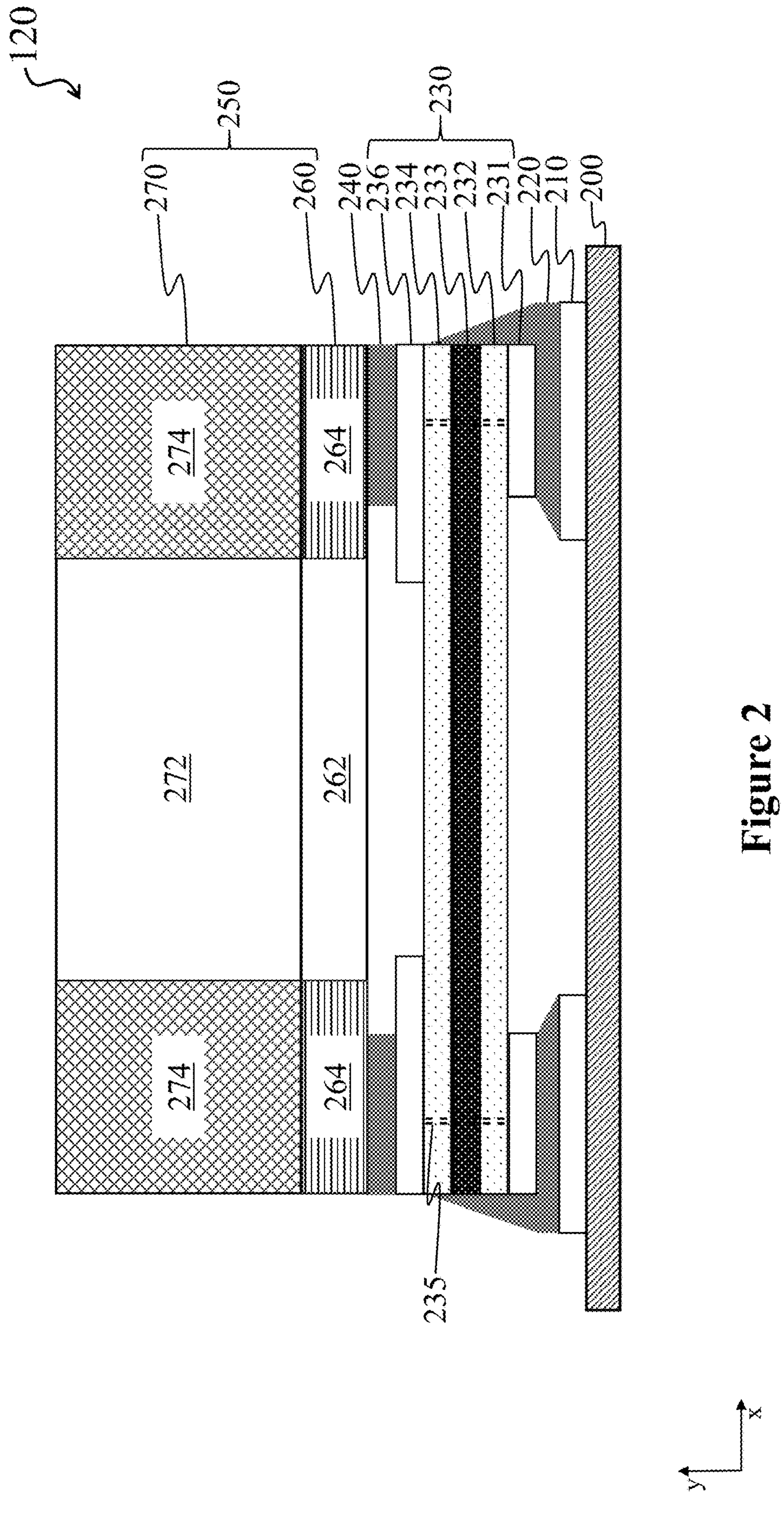
FIG. 2 is an illustration of a capacitor element with a damping structure, according to some embodiments.

FIG. 2 is an illustration of capacitor element 120 (e.g., one of capacitor elements $\mathbf{120_0}$-$\mathbf{120_2}$ of FIG. 1), according to some embodiments. Capacitor element 120 includes a substrate 200, contact pads 210, solder layers 220, a damping structure 230, solder layers 240, and a capacitor structure 250.

In some embodiments, substrate 200 is a FR4 printed circuit board. Substrate 200 can be other suitable types of substrates and printed circuit boards. Contact pads 210 are disposed on substrate 200 (e.g., on left and right portions of substrate 200 in the x-direction). In some embodiments, contact pads 210 are made of copper or any other suitable type of conductive material. Solder layers 220 are disposed on contact pads 210. Due to wetting during the soldering process, solder layers 220 can climb (e.g., in the y-direction) and contact a side surface of damping structure 230, as shown in FIG. 2.

In some embodiments, solder layers 220 can be a solder flux used in a pin transfer process, a nickel paste, a lead-free alloy (e.g., containing about 96.5% tin, about 3% silver, and about 0.5% copper), or any other suitable type of solder material. In some embodiments, depending on a height restriction of an electronic package or electronic casing with printed circuit board 100 (of FIG. 1) implemented within and a height of capacitor structure 250 (e.g., a thicker capacitor 270—in the y-direction—can provide more capacitance), the type of solder for solder layer 220 can vary. For example, the nickel paste solder can introduce a thickness (e.g., in the y-direction) between contact pads 210 and damping structure 230 of about 50 μm. The lead-free alloy (e.g., containing about 96.5% tin, about 3% silver, and about 0.5% copper) can introduce a thickness (e.g., in the y-direction) between contact pads 210 and damping structure 230 of about 25 μm. For the height restricted electronic package or electronic casing and for increased capacitance in capacitor structure 250, the lead-free alloy may be preferable for solder layers 220.

Damping structure 230 includes contact pads 231, a rigid material layer 232, a damping material layer 233, a rigid material layer 234, conductive structures 235, and contact pads 236, according to some embodiments. Contact pads 231 are disposed on a bottom surface of rigid material layer 232 (e.g., on left and right portions of rigid material layer 232 in the x-direction). Contact pads 231 are further disposed on solder layers 220. In some embodiments, contact pads 231 are made of copper or any other suitable type of conductive material. Contact pads 236 are disposed on a top surface rigid material layer 234 (e.g., on left and right portions of rigid material layer 234 in the x-direction). In some embodiments, contact pads 236 are made of copper or any other suitable type of conductive material.

Figure 3:
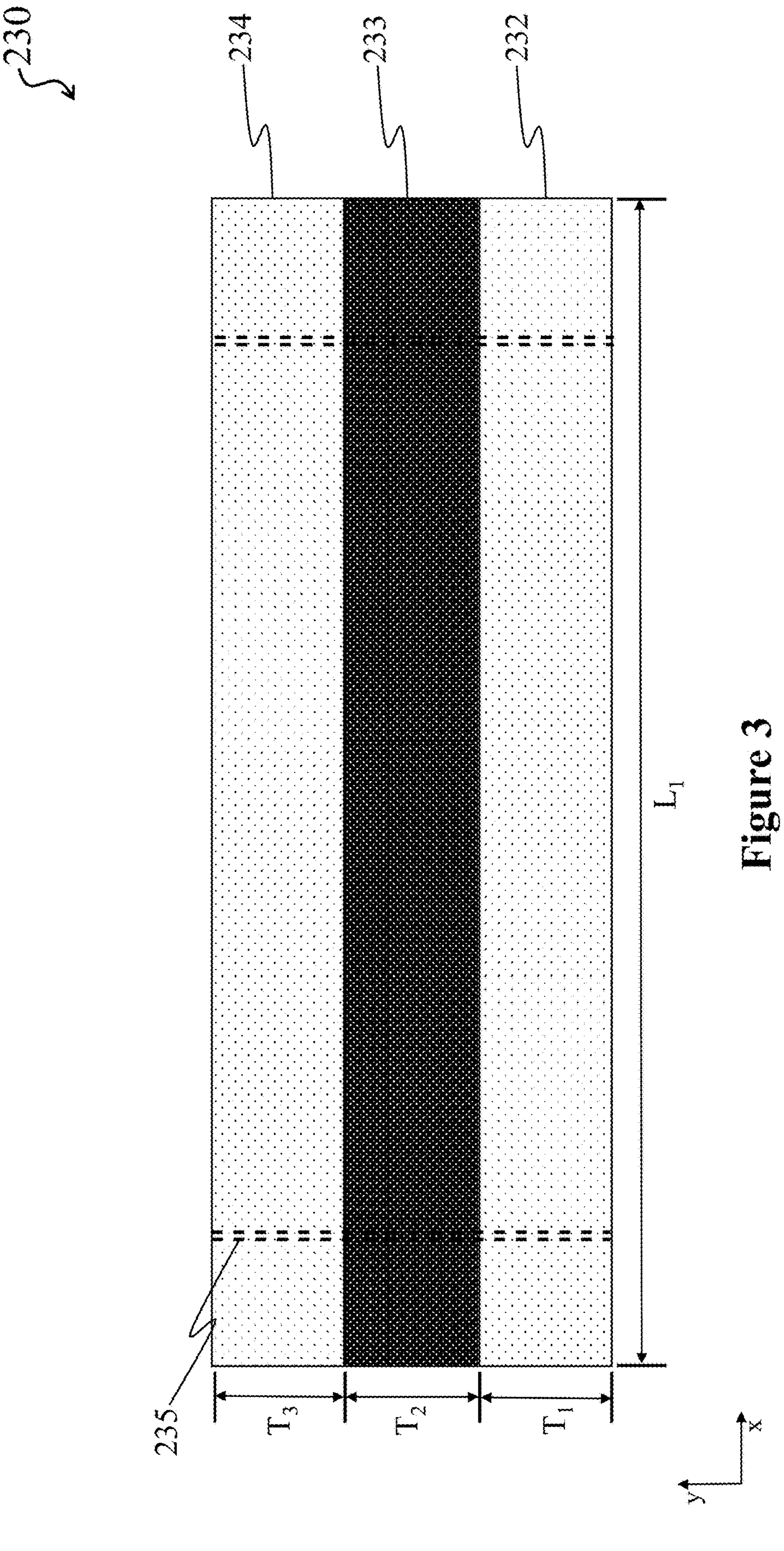
FIG. 3 is an illustration of a damping structure, according to some embodiments.

FIG. 3 is an illustration of a zoomed-in view of a portion of damping structure 230, according to some embodiments. Rigid material layer 232 and rigid material layer 234 can each be made of an FR4 material and can have a thickness $T_1$ and a thickness $T_3$ (e.g., in the y-direction), respectively, between about 30 μm and about 35 μm.

Damping material layer 233 is disposed between rigid material layer 232 and rigid material layer 234, according to some embodiments. In some embodiments, damping material layer 233 can be made of a damping material with one or more of the following material properties:

- Tensile Strength: about 18 MPa to about 22 MPa;
- Young's modulus: about 0.4 GPa to about 0.6 GPa;
- Elongation: about 9% to about 12%;
- Coefficient of Thermal Expansion (in the x-y direction; ppm: about 25° C. to about 150° C.): about 90 ppm/° C. to about 110 ppm/° C.;
- Coefficient of Thermal Expansion (in the x-y direction; ppm: about 150° C. to about 240° C.): about 150 ppm/° C. to about 170 ppm/° C.;
- Dielectric Constant: about 2.5 to about 3.5; and
- Loss Tangent: about 0.005 to about 0.015.

In some embodiments, the material properties of the damping material in damping layer 233 can be the following:

- Tensile Strength: about 20 MPa;
- Young's modulus: about 0.5 GPa;
- Elongation: about 10%;
- Coefficient of Thermal Expansion (in the x-y direction; ppm: about 25° C. to about 150° C.): about 90 ppm/° C.;
- Coefficient of Thermal Expansion (in the x-y direction; ppm: about 150° C. to about 240° C.): about 170 ppm/° C.;
- Dielectric Constant: about 3; and
- Loss Tangent: about 0.01.

In some embodiments, the material properties of the damping material in damping layer 233 can be the following:

- Tensile Strength: about 19 MPa;
- Young's modulus: about 0.5 GPa;
- Elongation: about 10.8%;
- Coefficient of Thermal Expansion (in the x-y direction; ppm: about 25° C. to about 150° C.): about 98 ppm/° C.;
- Coefficient of Thermal Expansion (in the x-y direction; ppm: about 150° C. to about 240° C.): about 163 ppm/° C.;
- Dielectric Constant: about 2.8; and
- Loss Tangent: about 0.0133.

In some embodiments, the above material properties of the damping material in damping layer 233 mitigate (or eliminate) piezoelectric and electrostrictive vibrations generated by capacitor structure 250 during operation from being transferred to substrate 200. By absorbing (or damping) the piezoelectric and electrostrictive vibrations, damping layer 233 prevents these vibrations from being transferred to substrate 200—thus mitigating (or eliminating) an undesirable resonance in the audible range (e.g., between about 20 Hz and about 20 kHz) from being generated by substrate 200 (or printed circuit board 100, which capacitor element 120 is disposed on).

Referring to FIG. 3, damping layer 233 can have a thickness $T_2$ between about 25 μm and about 40 μm, according to some embodiments. In some embodiments, depending on a height restriction of an electronic package or electronic casing with printed circuit board 100 (of FIG. 1) implemented within and a height of capacitor structure 250 (e.g., a taller capacitor 270 can provide more capacitance), the thickness $T_2$ of damping layer 233 can be greater than about 40 μm. Damping layer 233—as well as rigid material layer 232 and rigid material layer 234 can have a length $L_1$ (e.g., in the x-direction) between about 1.0 mm and about 1.2 mm.

Further, conductive structures 235 can be formed through rigid material layer 232, damping material layer 233, and rigid material layer 234 to electrically connect contact pads at a top surface of rigid material layer 234 (e.g., contact pads 236 of FIG. 2) to contact pads at a bottom surface of rigid material layer 232 (e.g., contact pads 231 of FIG. 2), according to some embodiments. Conductive structures 235 can be made of copper or any other suitable conductive material.

Referring to FIG. 2, solder layers 240 are disposed on contact pads 236 (of damping structure 230). Though not shown in FIG. 2, due to wetting during the soldering process, solder layers 240 can climb (e.g., in the y-direction) and contact a side surface of capacitor structure 250.

In some embodiments, solder layers 240 can be a solder flux used in a pin transfer process, a nickel paste, a lead-free alloy (e.g., containing about 96.5% tin, about 3% silver, and about 0.5% copper), or any other suitable type of solder material. In some embodiments, depending on a height restriction of an electronic package or electronic casing with printed circuit board 100 (of FIG. 1) implemented within and a height of capacitor structure 250 (e.g., a thicker capacitor 270—in the y-direction—can provide more capacitance), the type of solder for solder layer 220 can vary. For example, the nickel paste solder can introduce a thickness (e.g., in the y-direction) between damping structure 230 and capacitor structure 250 of about 50 μm. The lead-free alloy (e.g., containing about 96.5% tin, about 3% silver, and about 0.5% copper) can introduce a thickness (e.g., in the y-direction) between damping structure 230 and capacitor structure 250 of about 25 μm. For the height restricted electronic package or electronic casing and for an increased capacitance in capacitor structure 250, the lead-free alloy may be preferable for solder layers 240.

Capacitor structure 250 includes an interposer 260 and a capacitor 270, according to some embodiments. Interposer 260 can be disposed on a bottom surface of capacitor 270 to partially suppress piezoelectric and electrostrictive vibrations generated by capacitor 270 during operation—but does not suppress the vibrations completely. As discussed above, the damping material in damping material layer 233 (of FIG. 2) further absorbs the piezoelectric and electrostrictive vibrations to prevent these vibrations from being transferred to substrate 200 thus mitigating (or eliminating) an undesirable resonance in the audible range (e.g., between about 20 Hz and about 20 kHz) from being generated by substrate 200 (or printed circuit board 100, which capacitor element 120 is disposed on).

Figure 4:
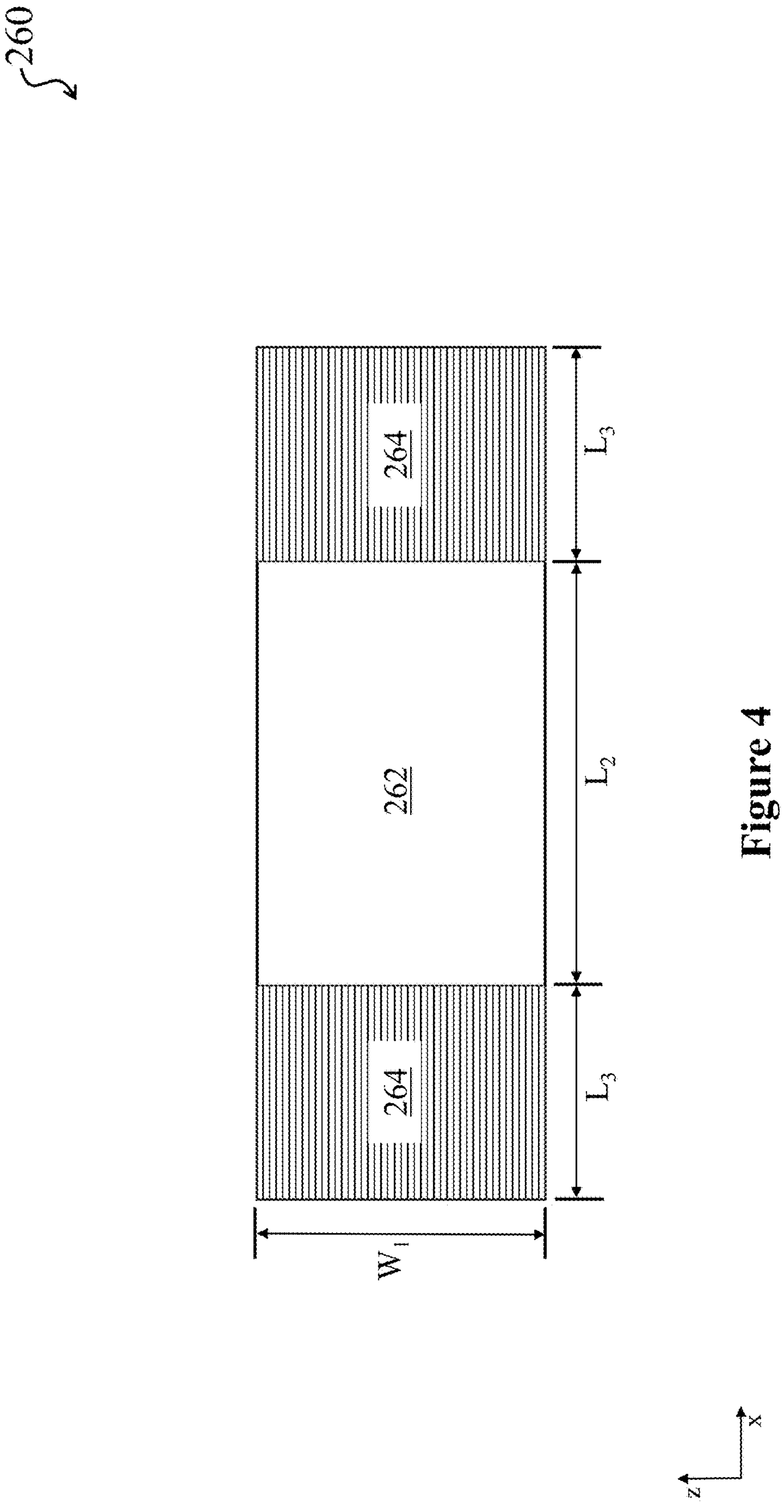
FIG. 4 is an illustration of an interposer in a capacitor structure, according to some embodiments.

FIG. 4 is an illustration of a bottom surface of interposer 260, according to some embodiments. Interposer 260 is a substrate with a central region 262 and contact pad regions 264 adjacent to central region 262. Central region 262 can correspond to an area below a central region of capacitor 270 (not shown) disposed on interposer 260. Central region 262 can have a length $L_2$ (e.g., in the x-direction) between about 0.4 mm and about 0.5 mm (e.g., about 0.45 mm). Contact pad regions 264 can correspond to solder areas used to attach capacitor 270 to interposer 260 and to attach interposer 260 to solder layers 240 (in FIG. 2). In some embodiments, contact pad regions 264 can have a rectangular shape, as shown in FIG. 4. Contact pad regions 264 can have a length $L_3$ (e.g., in the x-direction) between about 0.2 mm and about 0.4 mm (e.g., about 0.3 mm). A width $W_1$ (e.g., in the z-direction) of central region 262 and contact pad regions 264 can be between about 0.5 mm and about 0.6 mm (e.g., about 0.57 mm). Further, a thickness of interposer 260 (e.g., in the y-direction; not shown in FIG. 4) can be between about 0.03 mm and about 0.05 mm (e.g., about 0.04 mm).

Figure 5:
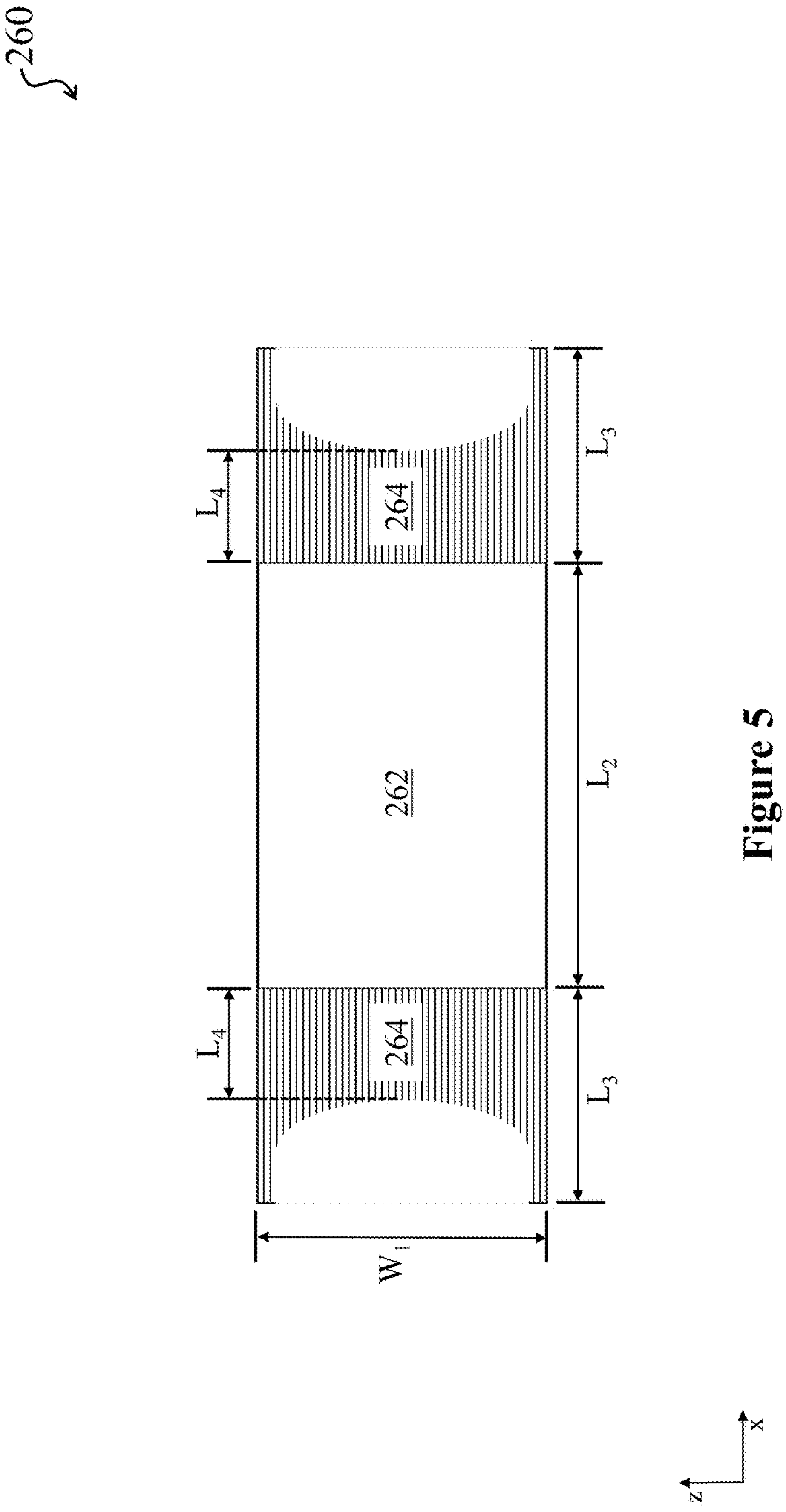
FIG. 5 is an illustration of another interposer in a capacitor structure, according to some embodiments.

FIG. 5 is an illustration of another bottom surface of interposer 260, according to some embodiments. Interposer 260 is a substrate with central region 262 and contact pad regions 264—similar to that described above with respect to FIG. 4. The length dimensions-length $L_2$ and length $L_3$—and width dimension-width $W_1$—are the same as those described above with respect to FIG. 4. In FIG. 5, contact pad regions 264 can correspond to solder areas used to attach capacitor 270 to interposer 260 and to attach interposer 260 to solder layers 240 (in FIG. 2). In some embodiments, contact pad regions 264 can have a curved side surface, as shown in FIG. 5. A length $L_4$ (e.g., in the x-direction) between a bottommost point in the curved side surface and a side surface of central region 262 is between about 0.1 mm and about 0.2 mm (e.g., about 0.16 mm).

Figure 6:
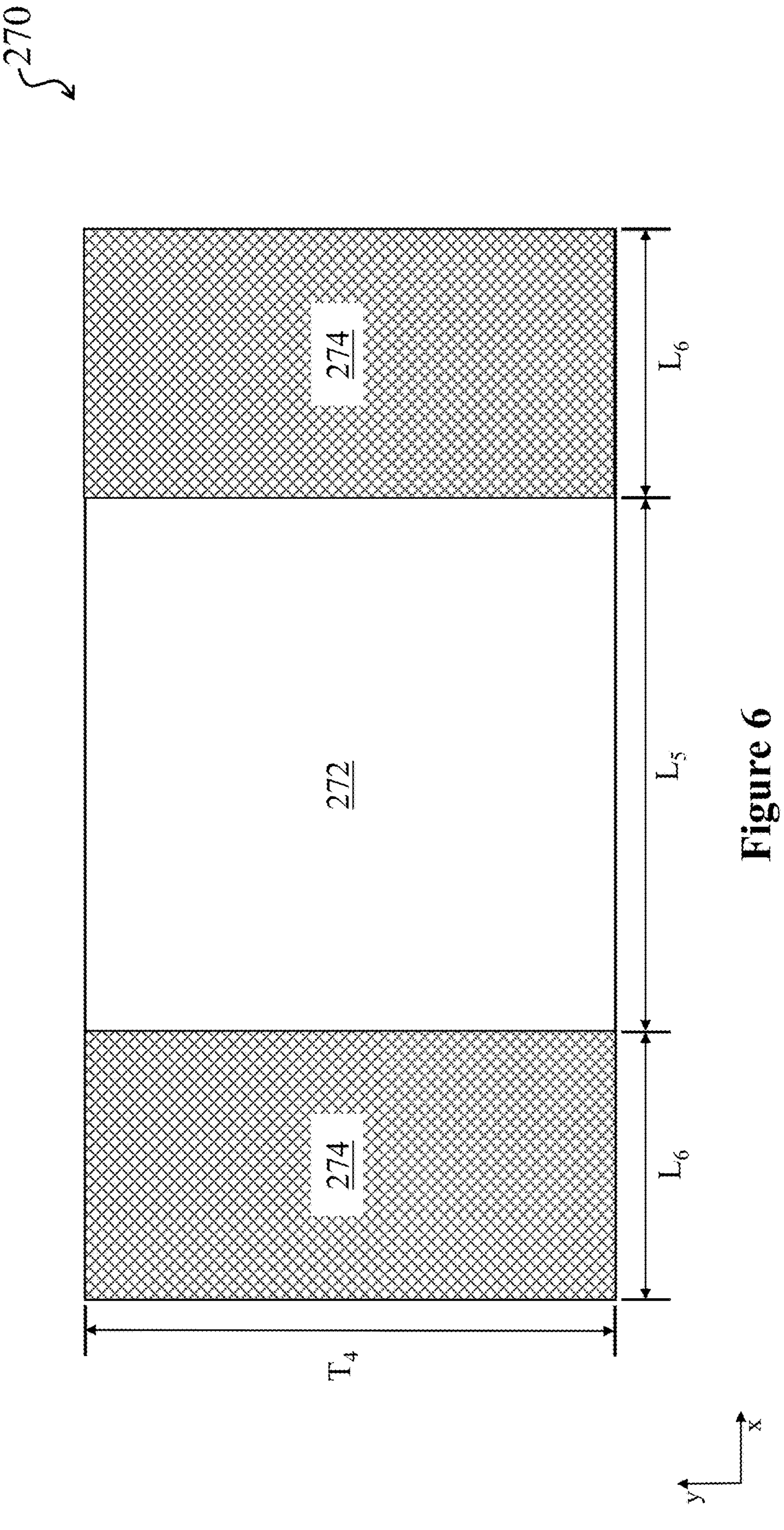
FIG. 6 is an illustration of a capacitor in a capacitor structure, according to some embodiments.

FIG. 6 is an illustration of capacitor 270 (of FIG. 2), according to some embodiments. Capacitor 270 can be a ceramic capacitor with a ceramic-based dielectric material, such as barium titanate. When an AC voltage is applied to capacitor 270, capacitor 270 can start to vibrate due to piezoelectricity. Also, an electric field generated between electrodes of capacitor 270 can create an electrostrictive vibration at a level similar to the piezoelectric vibration level. As discussed above, the damping material in damping material layer 233 (of FIG. 2) absorbs the piezoelectric and electrostrictive vibrations to prevent these vibrations from being transferred to substrate 200—thus mitigating (or eliminating) an undesirable resonance in the audible range (e.g., between about 20 Hz and about 20 kHz) from being generated by substrate 200 (or printed circuit board 100, which capacitor element 120 is disposed on).

Capacitor 270 includes a central region 272 and electrodes 274 adjacent to central region 272. Central region 272 includes a ceramic material, such as barium titanate. Central region 272 can have a length $L_5$ (e.g., in the x-direction) between about 0.7 mm to about 0.8 mm (e.g., about 0.8 mm). Electrodes 274 can be made of copper or any suitable conductive material and can electrically connect to the ceramic material in central region 272 to form capacitor 270. Electrodes 274 also electrically connect to contact pad regions 264 of interposer 260 (not shown). Electrodes 274 can have a length $L_6$ (e.g., in the x-direction) between about 0.2 mm and 0.4 mm (e.g., about 0.3 mm). A thickness $T_4$ (e.g., in the y-direction) of central region 272 and electrodes 274 can be between about 0.5 mm and about 0.6 mm (e.g., about 0.55 mm).

Figure 7:
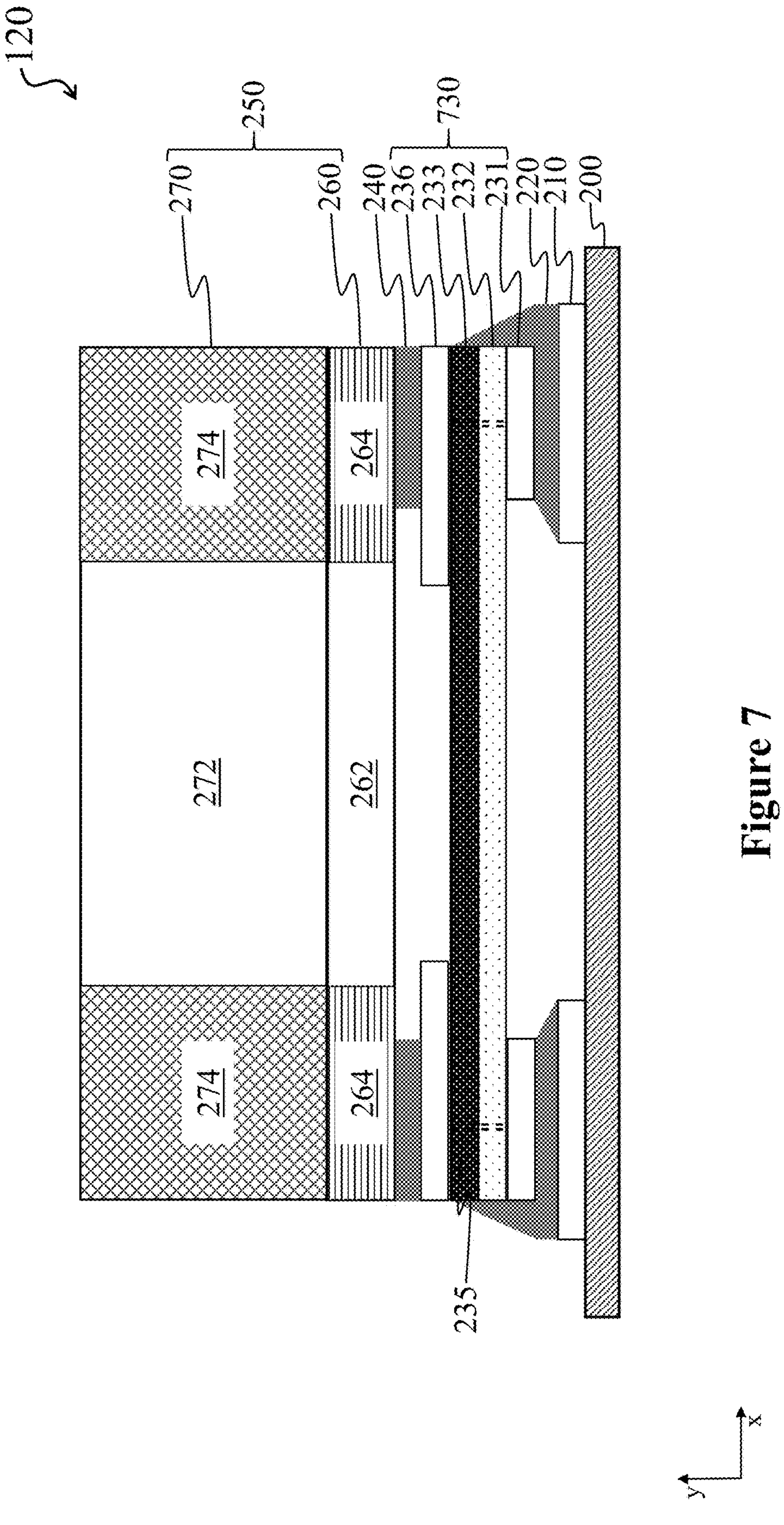
FIG. 7 is an illustration of another capacitor element with a damping structure, according to some embodiments.

FIG. 7 is an illustration of another capacitor element 120 (e.g., one of capacitor elements $\mathbf{120_0}$-$\mathbf{120_2}$ of FIG. 1), according to some embodiments. Capacitor element 120 includes substrate 200, contact pads 210, solder layers 220, a damping structure 730, solder layers 240, and capacitor structure 250. The descriptions of substrate 200, contact pads 210, solder layers 220, solder layers 240, and capacitor structure 250 are similar to the descriptions above with respect to FIGS. 2-6, except for modifications described below.

Damping structure 730 includes contact pads 231, rigid material layer 232, damping material layer 233, conductive structures 235, and contact pads 236, according to some embodiments. Damping material layer 233 is disposed on rigid material layer 232, according to some embodiments. Conductive structures 235 are formed through rigid material layer 232 and damping material layer 233 to electrically connect contact pads 231 to contact pads 236. The descriptions of rigid material layer 232, damping material layer 233, and conductive structures 235 are similar to the descriptions above with respect to FIGS. 2 and 3.

In contrast to damping structure 230 of FIG. 2, damping structure 730 of FIG. 7 does not include a rigid material layer disposed on damping material layer 233. Without this rigid material layer, damping material layer 233 can be thicker (e.g., in the y-direction) than its implementation in damping structure 230, according to some embodiments. The thicker damping material layer 233 of FIG. 7 can further mitigate (or eliminate) undesirable noises generated by substrate 200 (or printed circuit board 100, which capacitor element 120 is disposed on). As discussed above, the material properties of the damping material in damping layer 233 mitigate (or eliminate) piezoelectric and electrostrictive vibrations generated by capacitor structure 250 during operation from being transferred to substrate 200. By absorbing (or damping) the piezoelectric and electrostrictive vibrations, damping layer 233 prevents these vibrations from being transferred to substrate 200—thus mitigating (or eliminating) an undesirable resonance in the audible range (e.g., between about 20 Hz and about 20 kHz) from being generated by substrate 200 (or printed circuit board 100, which capacitor element 120 is disposed on).

Referring to FIG. 7, contact pads 236 are disposed on damping material layer 233 (e.g., on left and right portions of damping material layer 233 in the x-direction). Solder layers 240 and capacitor structure 250 are disposed on contact pads 236 in a similar manner as described above with respect to FIGS. 2-6.

In summary, damping structure 230 of FIG. 2 and damping structure 730 of FIG. 7 mitigate (or eliminate) the transfer of piezoelectric and electrostrictive vibrations from capacitor structure 250 during operation to substrate 200 (or printed circuit board 100, which capacitor element 120 is disposed on)—thus, mitigating (or eliminating) undesirable audible noise.

Figure 8:
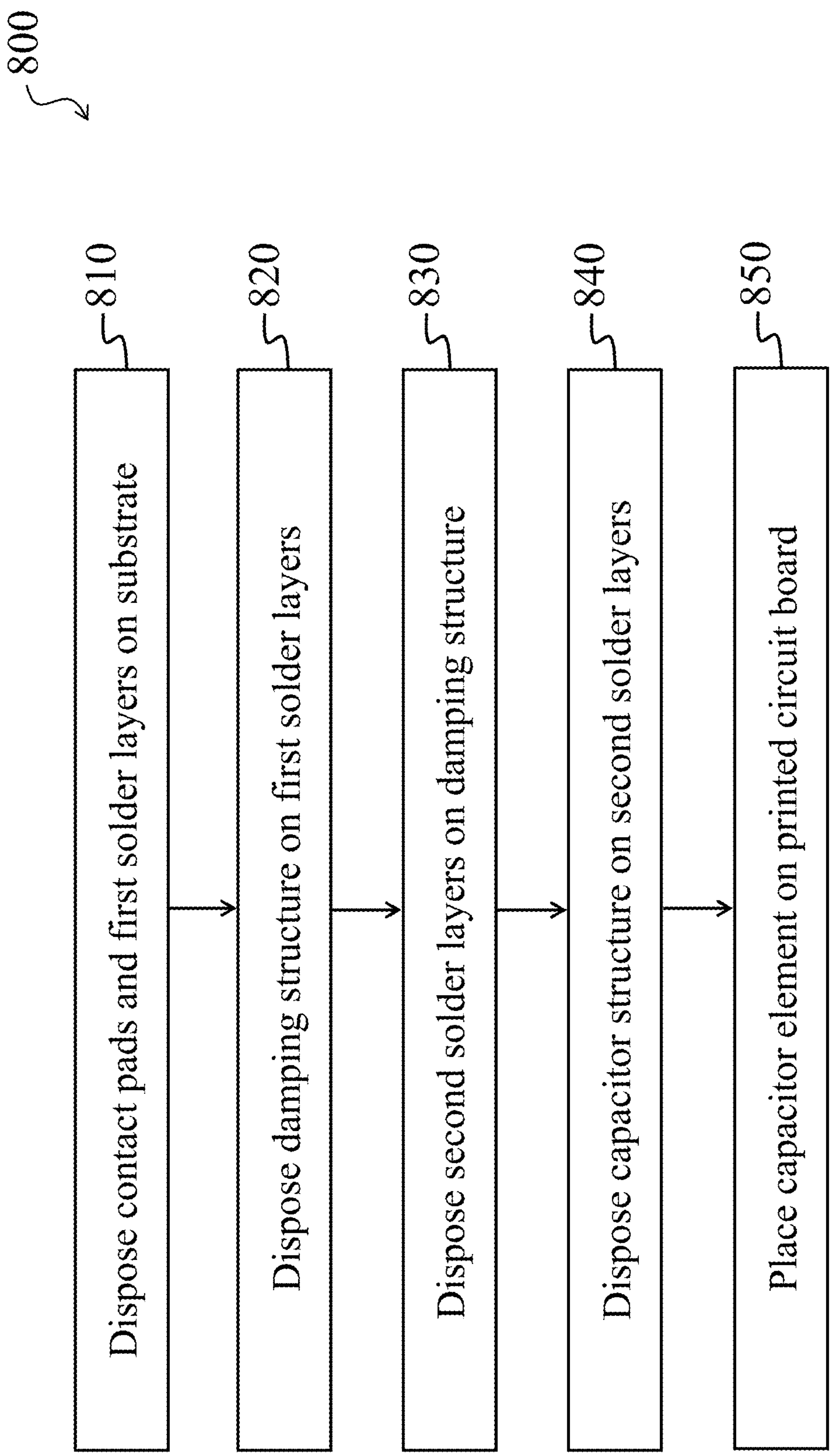
FIG. 8 is an illustration of a method for placing a capacitor element with a damping structure on a printed circuit board, according to some embodiments.

FIG. 8 is an illustration of a method 800 for placing a capacitor element with a damping structure on a printed circuit board, according to some embodiments. For illustrative purposes, the operations illustrated in method 800 will be described with reference to FIGS. 1, 2, 7, and 9-17, which include intermediate structures of capacitor element 120 in FIGS. 2 and 7. The descriptions of the common element numbers among these figures are provided above. Other printed circuit board and capacitor element designs and operations thereof are within the scope of the present disclosure. Also, additional operations may be performed between various operations of method 800 and may be omitted merely for clarity and ease of description. The additional operations can be provided before, during, and/or after method 800, in which one or more of these additional operations are briefly described herein. Moreover, not all operations may be needed to perform the disclosure provided herein. Additionally, some of the operations may be performed simultaneously or in a different order than shown in FIG. 8. In some embodiments, one or more other operations may be performed in addition to or in place of the presently-described operations.

Figure 9:
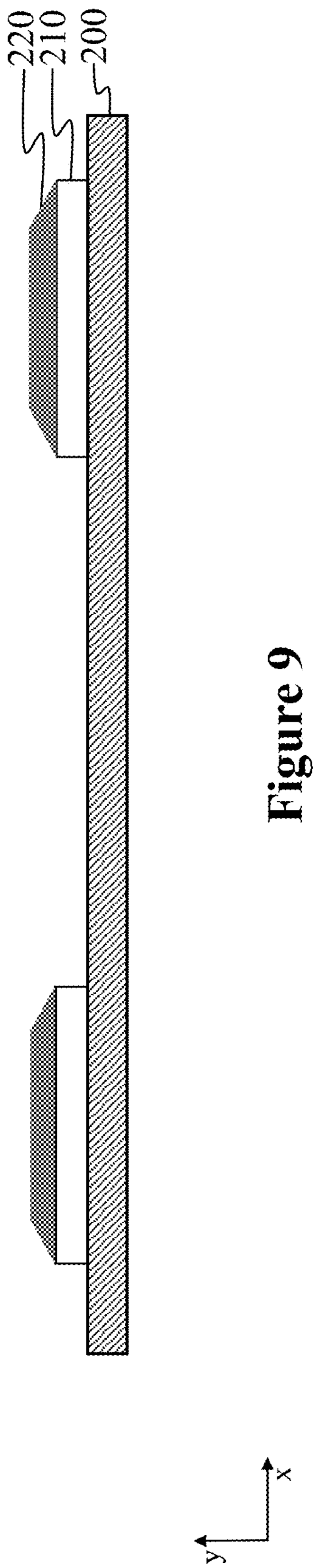
FIGS. 9-17 are intermediate structures during a placement of a capacitor element with a damping structure on a printed circuit board, according to some embodiments.

In operation 810, contact pads and first solder layers are disposed on a substrate. Referring to FIG. 9, contact pads 210 are disposed on substrate 200. Also, solder layers 220 are disposed on contact pads 210. In some embodiments, solder layers 220 can be a solder flux used in a pin transfer process, a nickel paste, a lead-free alloy (e.g., containing about 96.5% tin, about 3% silver, and about 0.5% copper), or any other suitable type of solder material.

Figure 10:
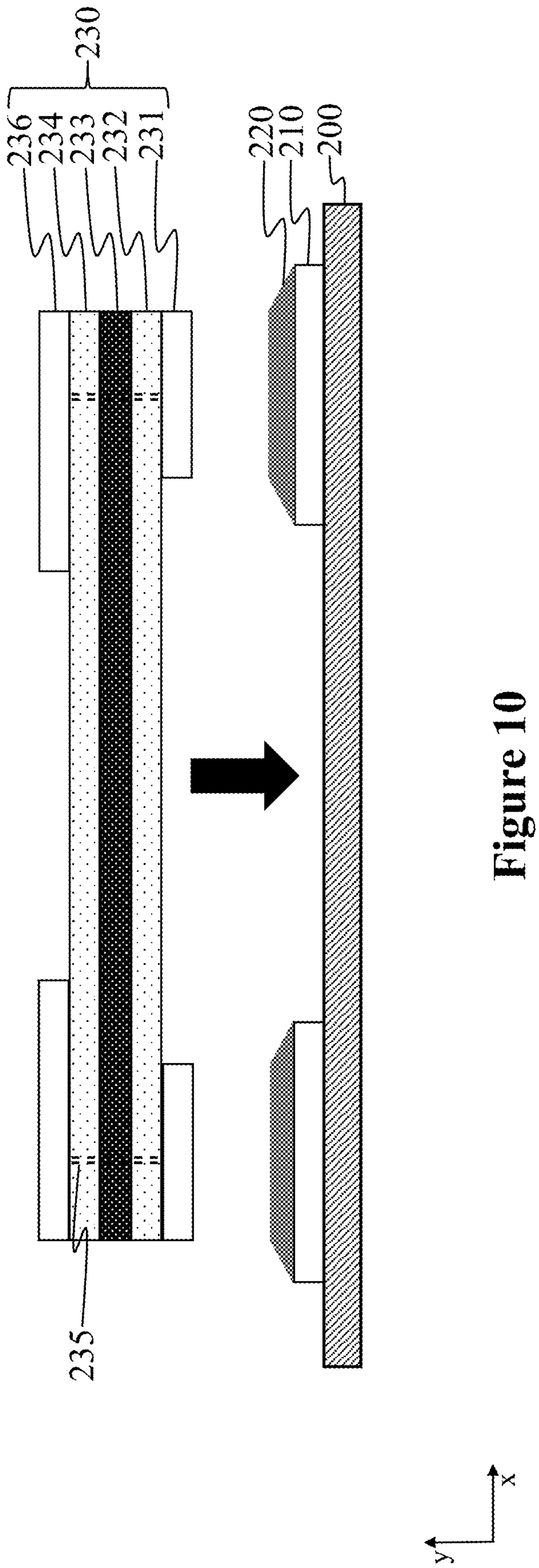

In operation 820, a damping structure is disposed on the first solder layers. Referring to FIG. 10, damping structure 230 is disposed on solder layers 220. The formation of damping structure 230 can include disposing contact pads 231 on rigid material layer 232, disposing damping material layer 233 on rigid material layer 232, disposing rigid material layer 234 on damping material layer 233, forming conductive structures 235 through rigid material layer 232, damping material layer 233, and rigid material layer 234, and disposing contact pads 236 on rigid material layer 234. Damping structure 230 can be made of a damping material with one of more of the material properties—e.g., tensile strength, Young's modulus, elongation, coefficient of thermal expansion, dielectric constant, and loss tangent-described above with respect to FIG. 3. Conductive structures 235 electrically connect contact pads 236 to contact pads 231.

Figure 11:
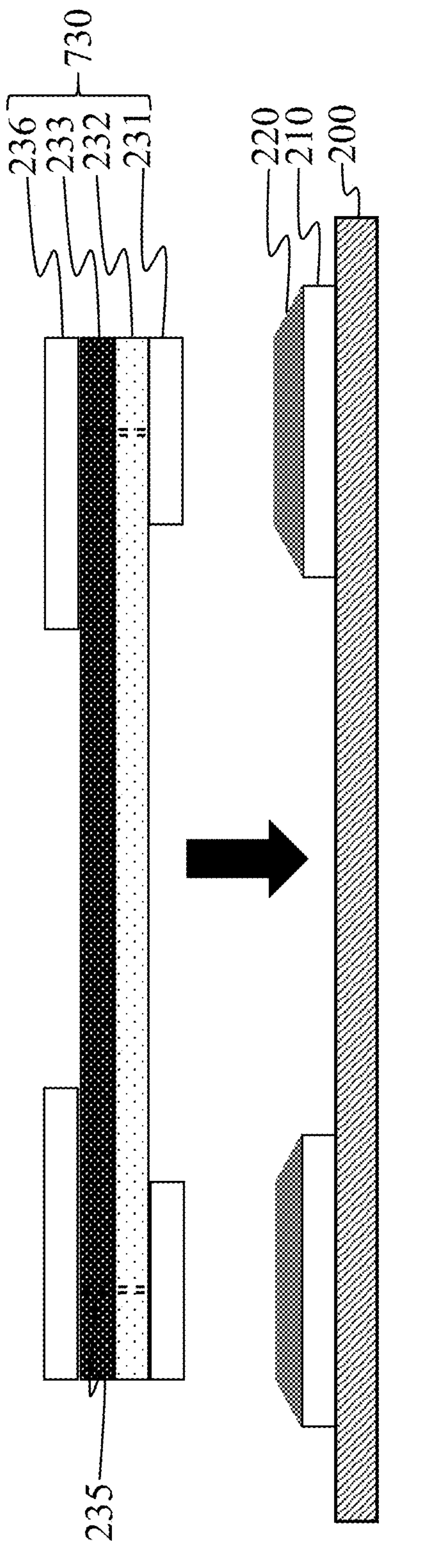
Figure 11:
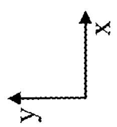

In a similar manner, referring to FIG. 11, damping structure 730 is disposed on solder layers 220. The formation of damping structure 730 can include disposing contact pads 231 on rigid material layer 232, disposing damping material layer 233 on rigid material layer 232, forming conductive structures 235 through rigid material layer 232 and damping material layer 233, and disposing contact pads 236 on damping material layer 233. Damping structure 230 can be made of a damping material with one of more of the material properties—e.g., tensile strength, Young's modulus, elongation, coefficient of thermal expansion, dielectric constant, and loss tangent-described above with respect to FIG. 3. Conductive structures 235 electrically connect contact pads 236 to contact pads 231.

Figure 12:
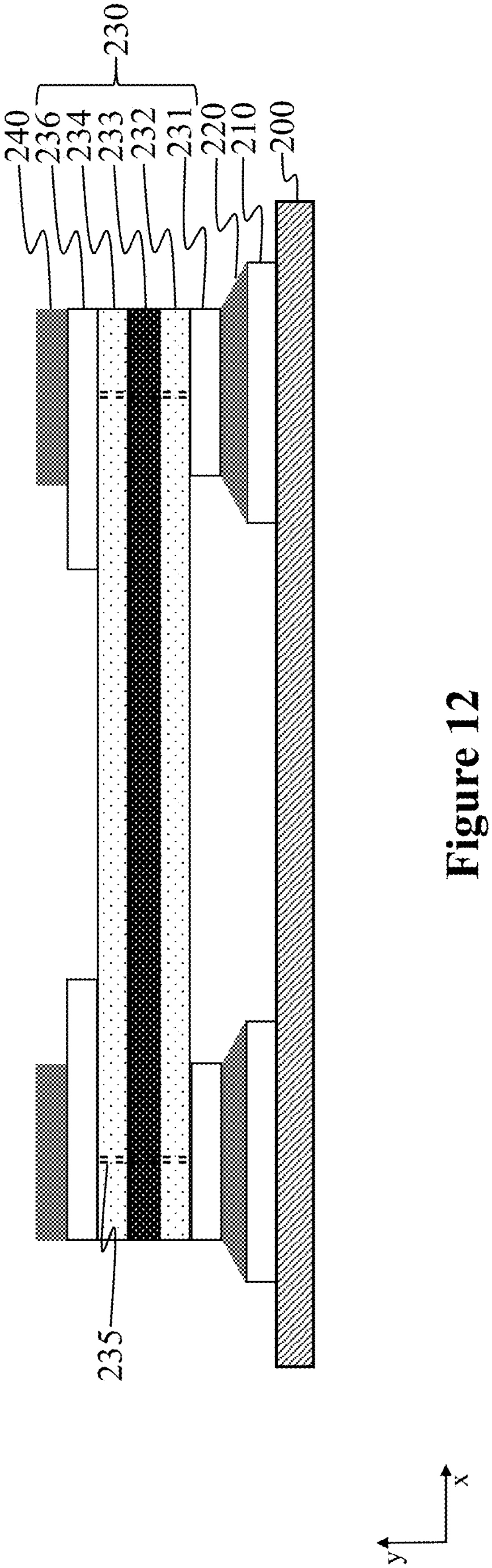
Figure 13:
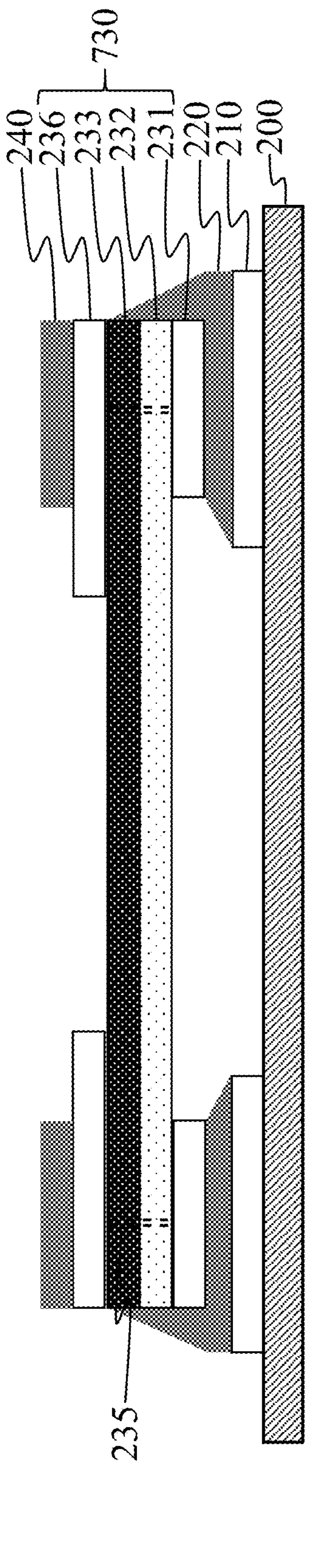

In operation 830, second solder layers are disposed on the damping structure. Referring to FIG. 12, solder layers 240 are disposed on contact pads 236. In some embodiments, solder layers 240 can be a solder flux used in a pin transfer process, a nickel paste, a lead-free alloy (e.g., containing about 96.5% tin, about 3% silver, and about 0.5% copper), or any other suitable type of solder material. In a similar manner, referring to FIG. 13, solder layers 240 are disposed on contact pads 236.

Figure 14:
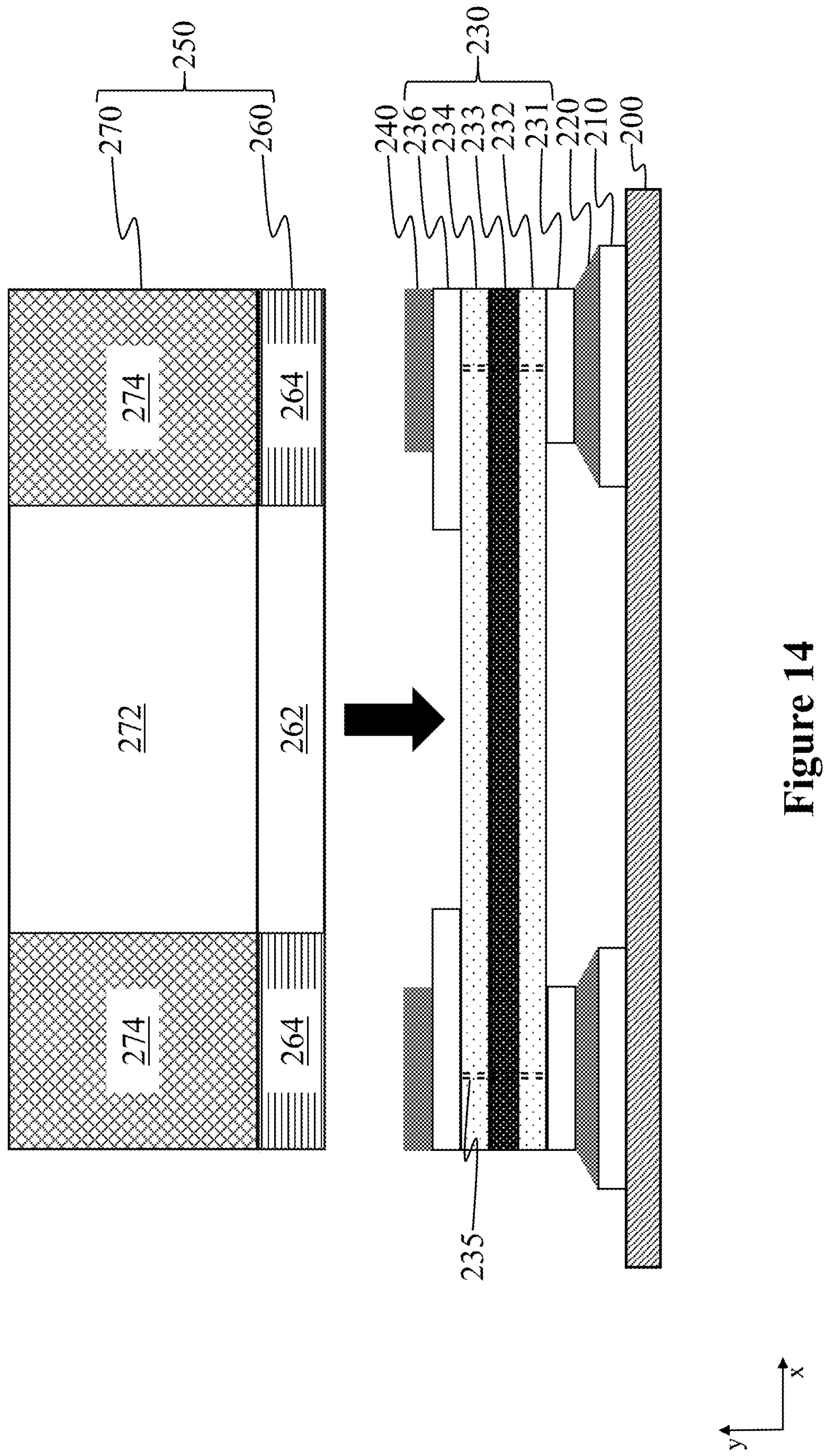
Figure 15:
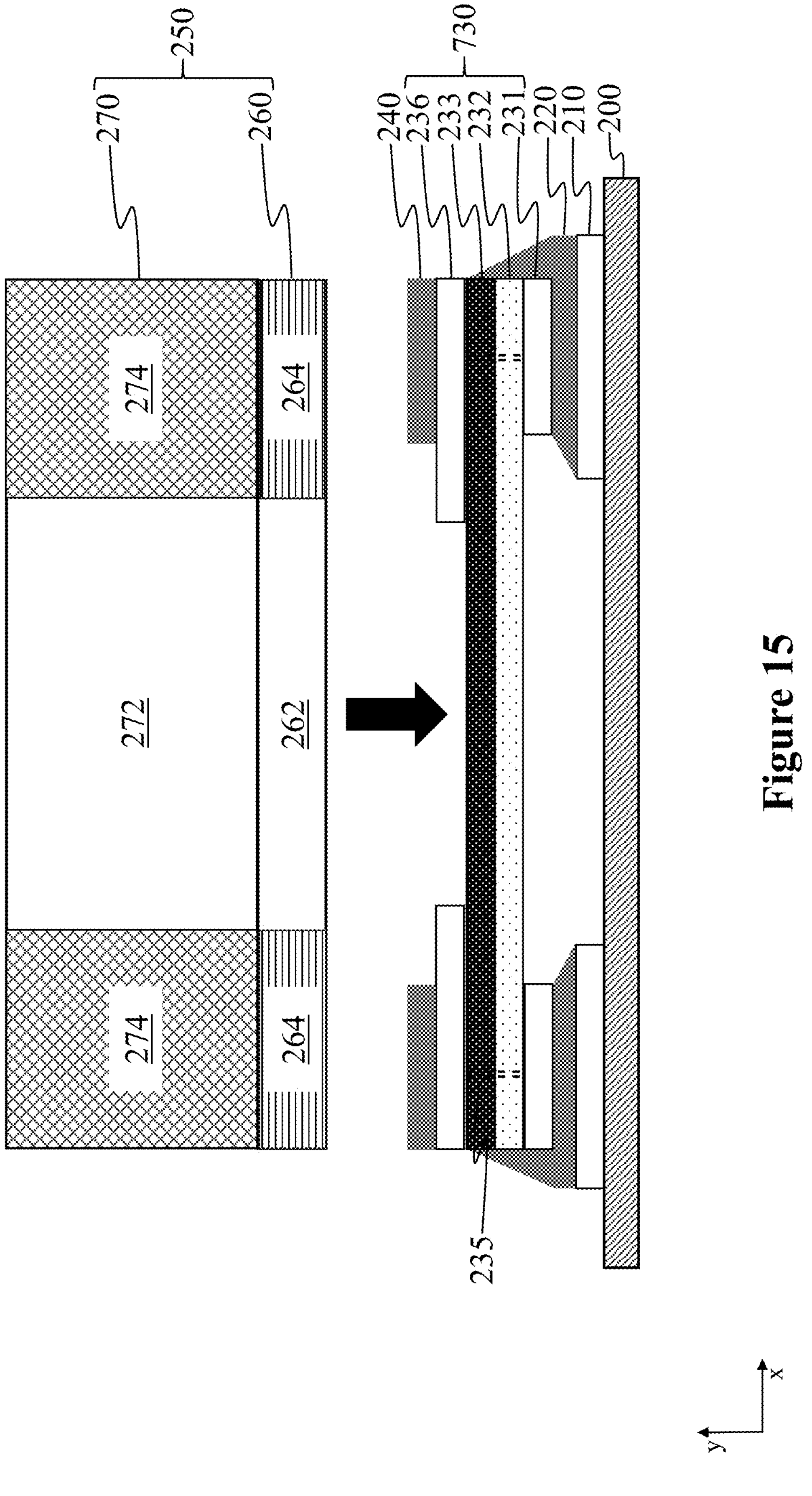

In operation 840, a capacitor structure is disposed on the second solder layers. Referring to FIG. 14, capacitor structure 250 is disposed on solder layers 240. The formation of capacitor structure 250 can include disposing a capacitor 270 on an interposer 260. Interposer 260 can have various shapes, as described above with respect to FIGS. 4 and 5. In a similar manner, referring to FIG. 15, capacitor structure 250 is disposed on solder layers 240. Operation 840 results in capacitor element 120 of FIGS. 2 and 7.

Figure 16:
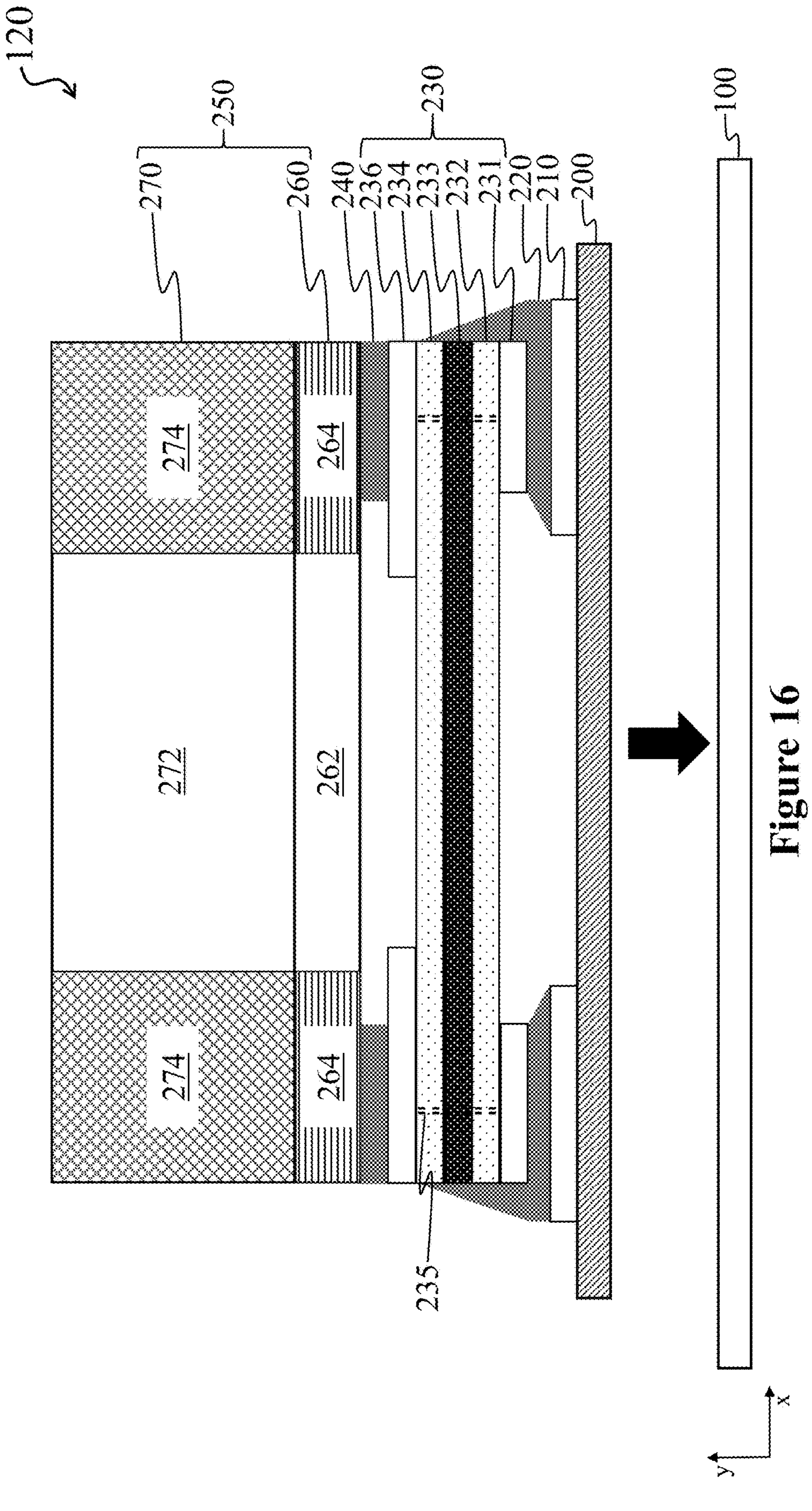
Figure 17:
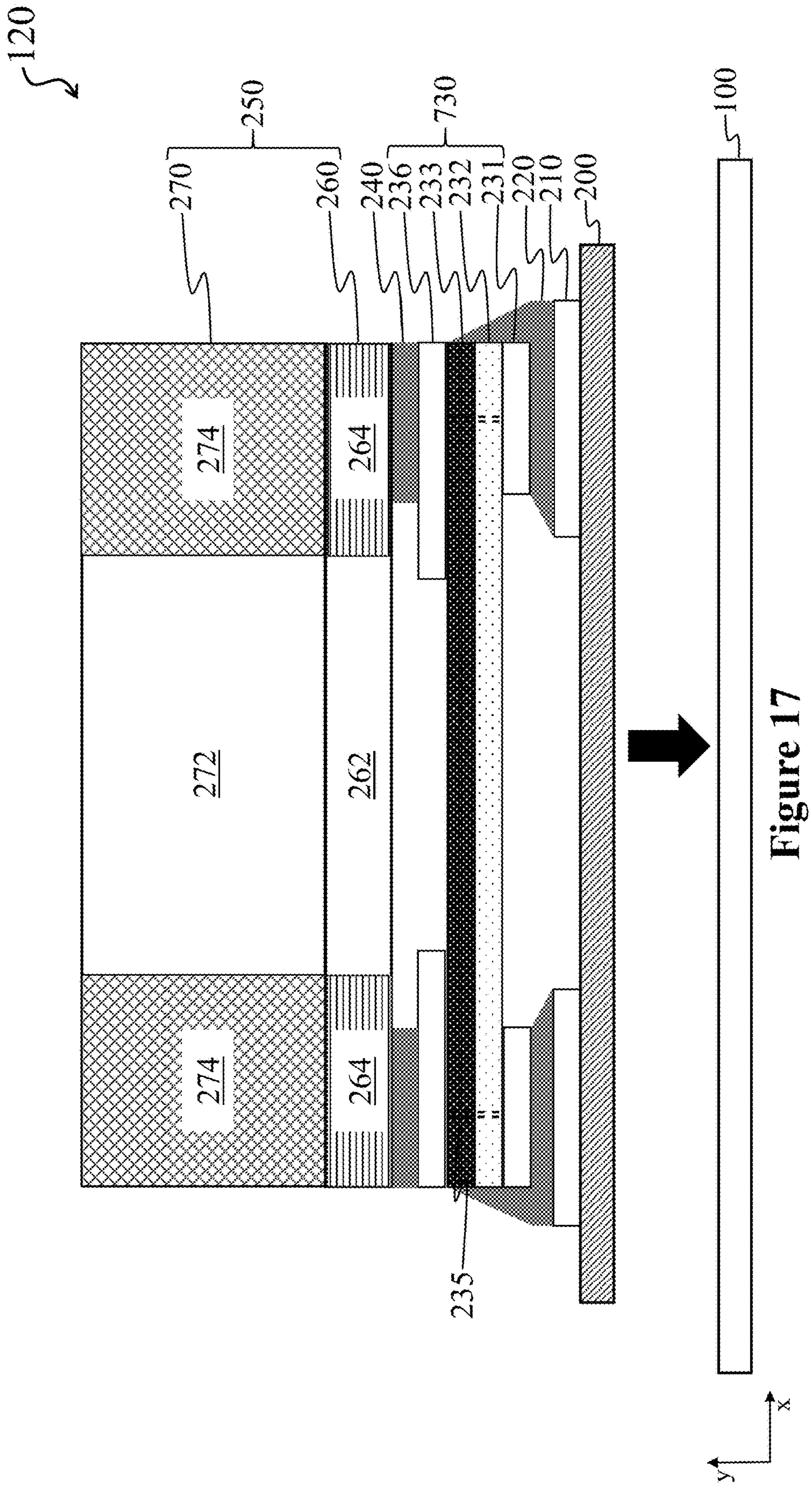

In operation 850, the capacitor element is placed on a printed circuit board. Referring to FIG. 16, capacitor element 120 (of FIG. 2) is placed on printed circuit board 100 (of FIG. 1). In a similar manner, referring to FIG. 17, capacitor element 120 (of FIG. 7) is placed on printed circuit board 100.

In some embodiments, capacitor element 120 (of FIGS. 2 and 7) is placed on printed circuit board 100 using a surface mount assembly process, where capacitor element 120 is one of multiple capacitor elements packaged into individual pockets of a carrier tape. The carrier tape can be loaded into component-placement equipment, where individual capacitor elements (e.g., capacitor elements $120_0$-$120_2$ of FIG. 1) are picked up from the carrier tape and placed into solder on printed circuit board 100.

Figure 18:
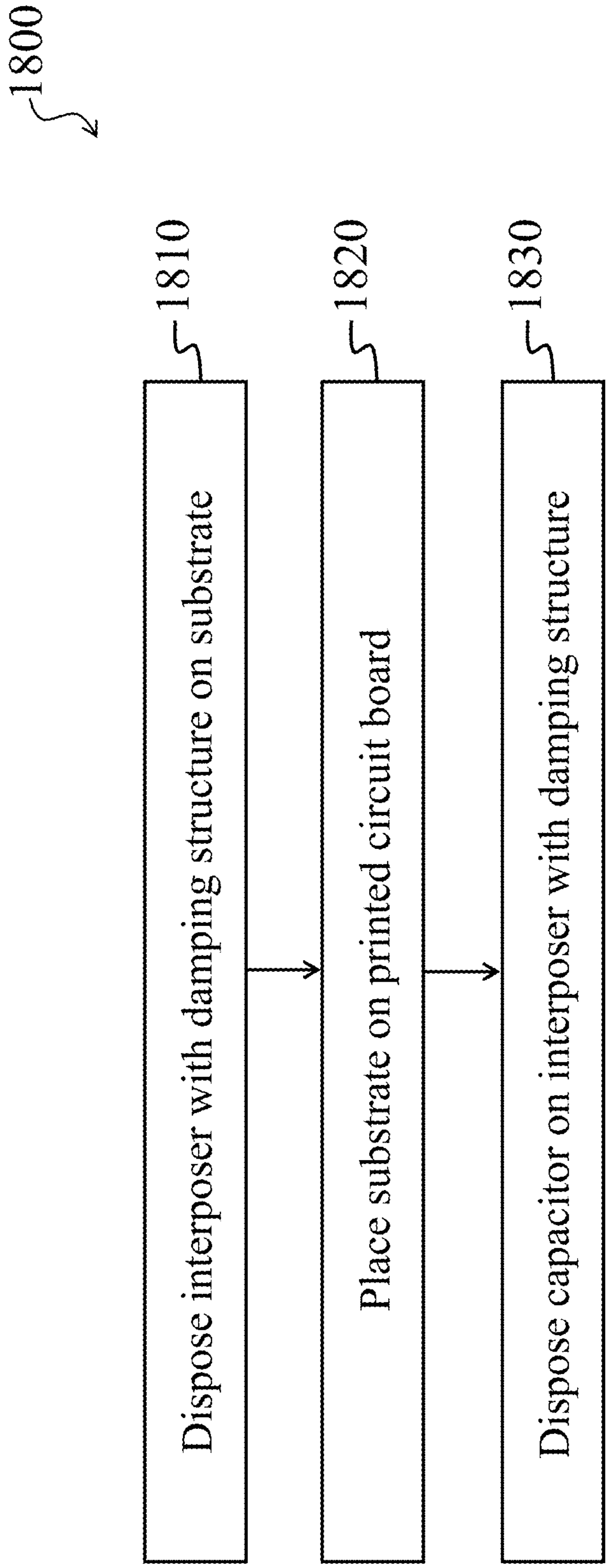
FIG. 18 is an illustration of another method for placing a capacitor element with a damping structure on a printed circuit board, according to some embodiments.

FIG. 18 is an illustration of a method 1800 forming a capacitor element with a damping structure, according to some embodiments. For illustrative purposes, the operations illustrated in method 1500 will be described with reference to FIGS. 2, 7, and 19-24, which include intermediate structures of capacitor element 120 in FIGS. 2 and 7. Other printed circuit board designs and operations thereof are within the scope of the present disclosure. Also, additional operations may be performed between various operations of method 1800 and may be omitted merely for clarity and ease of description. The additional operations can be provided before, during, and/or after method 1800, in which one or more of these additional operations are briefly described herein. Moreover, not all operations may be needed to perform the disclosure provided herein. Additionally, some of the operations may be performed simultaneously or in a different order than shown in FIG. 18. In some embodiments, one or more other operations may be performed in addition to or in place of the presently-described operations.

Figure 19:
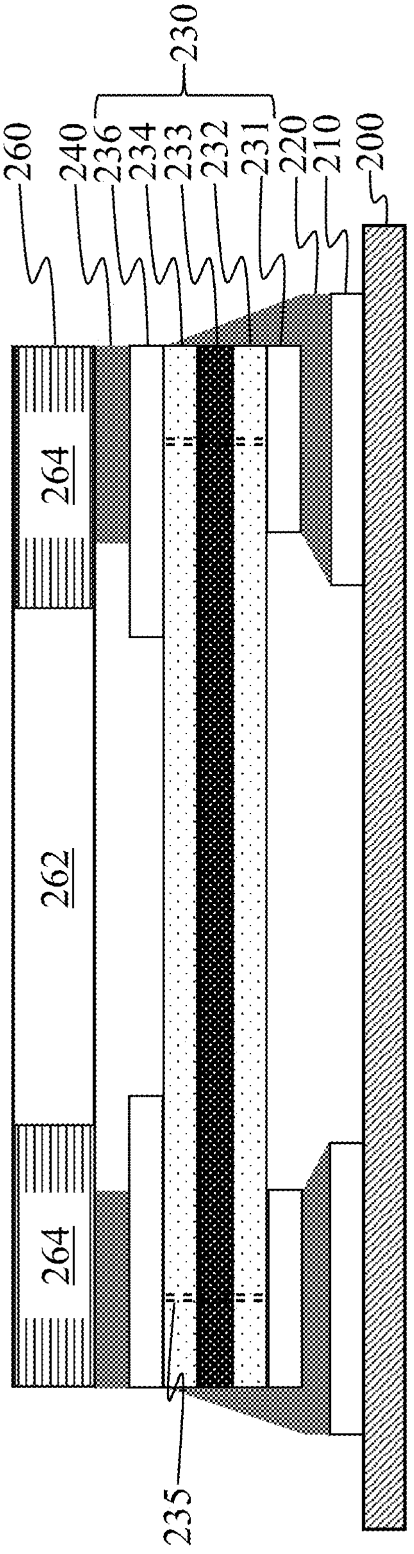

In operation 1810, an interposer with a damping structure is disposed on a substrate. Referring to FIG. 19, interposer 260 with damping structure 230 is disposed on substrate 200. Interposer 260 is disposed on damping structure 230 via solder layers 240. Also, damping structure 230 is disposed on substrate 200 via solder layers 220 and contact pads 210. Damping structure 230 can be made of a damping material with one of more of the material properties—e.g., tensile strength, Young's modulus, elongation, coefficient of thermal expansion, dielectric constant, and loss tangent-described above with respect to FIG. 3.

In a similar manner, referring to FIG. 20, interposer 260 with damping structure 730 is disposed on substrate 200. Interposer 260 is disposed on damping structure 730 via solder layers 240. Also, damping structure 730 is disposed on substrate 200 via solder layers 220 and contact pads 210. Damping structure 230 can be made of a damping material with one of more of the material properties—e.g., tensile strength, Young's modulus, elongation, coefficient of thermal expansion, dielectric constant, and loss tangent-described above with respect to FIG. 3.

Figure 21:
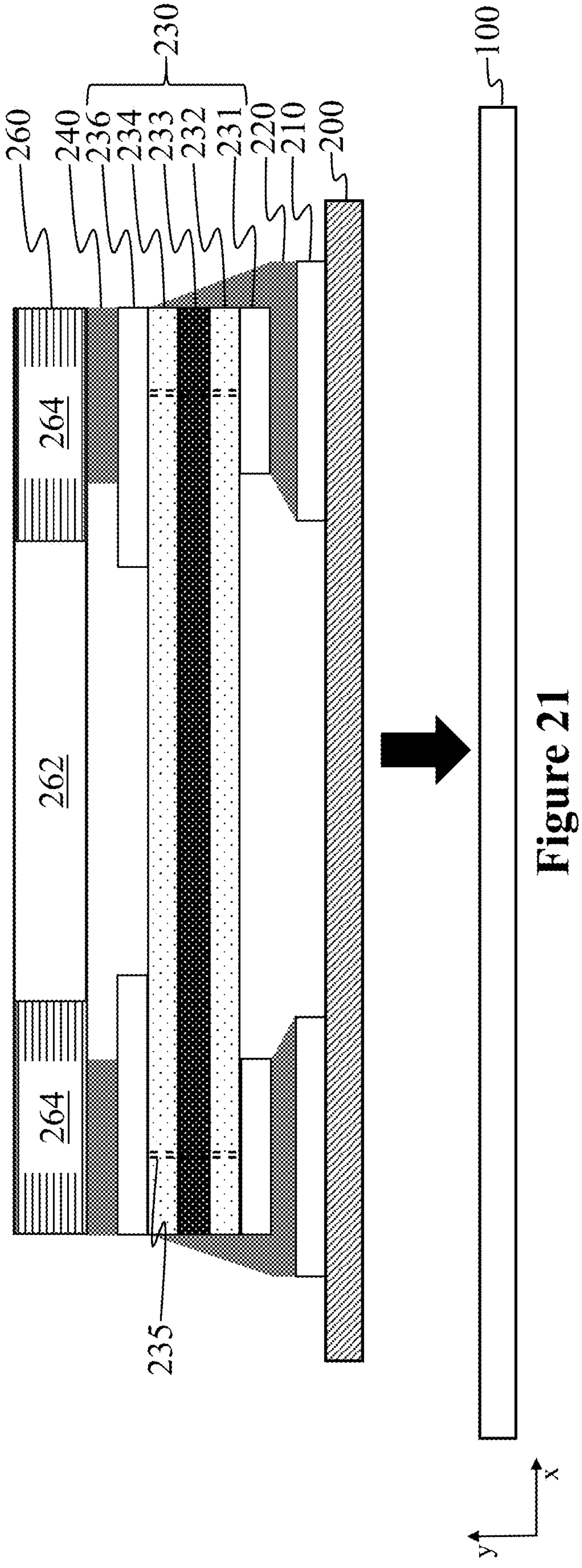
Figure 22:
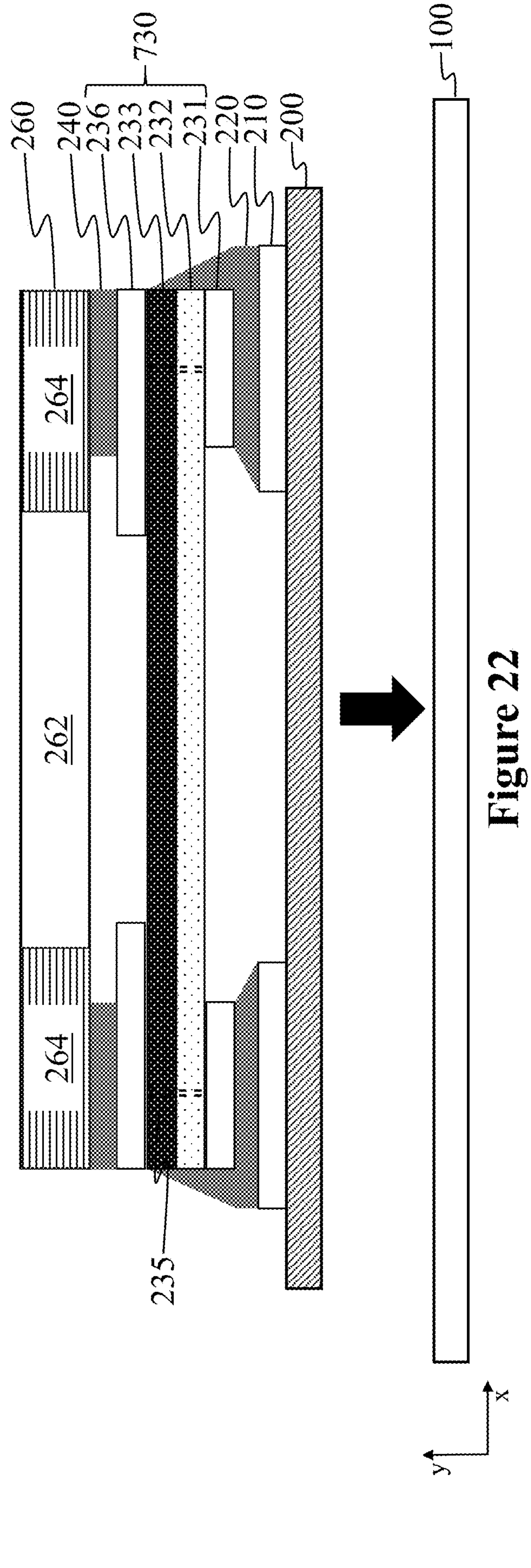

In operation 1820, the substrate with the interposer and damping structure is placed on a printed circuit board. Referring to FIG. 21, substrate 200 with interposer 260 and damping structure 230 is placed on printed circuit board 100 (of FIG. 1). In a similar manner, referring to FIG. 22, substrate 200 with interposer 260 and damping structure 730 is placed on printed circuit board 100.

In some embodiments, substrate 200 (with interposer 260 and damping structure 230/730 disposed thereon) is placed on printed circuit board 100 using a surface mount assembly process, where substrate 200 is one of multiple substrates (with an interposer and damping structure disposed thereon) packaged into individual pockets of a carrier tape. The carrier tape can be loaded into component-placement equipment, where individual substrates 200 are picked up from the carrier tape and placed into solder on printed circuit board 100.

Figure 23:
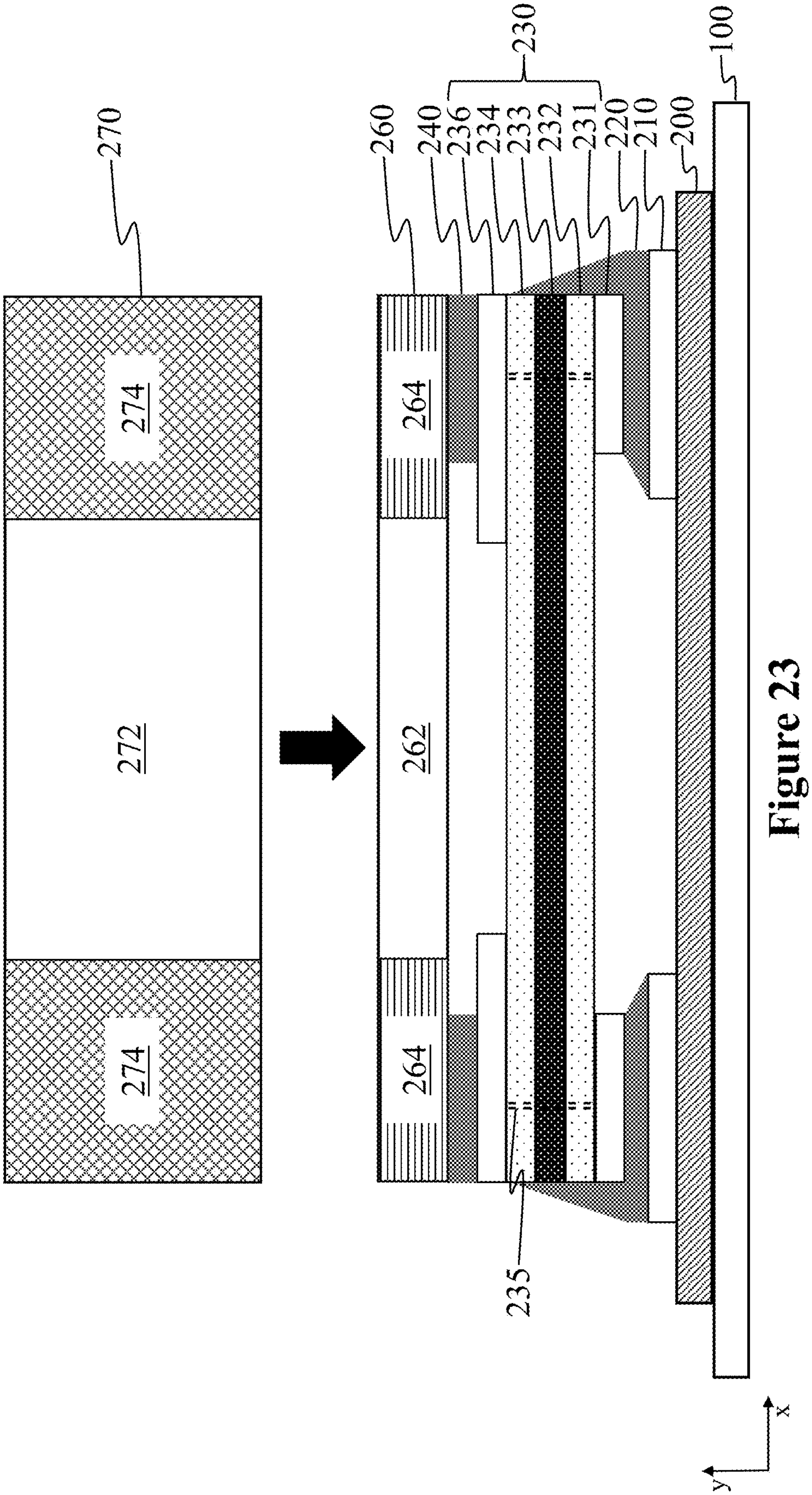
Figure 24:
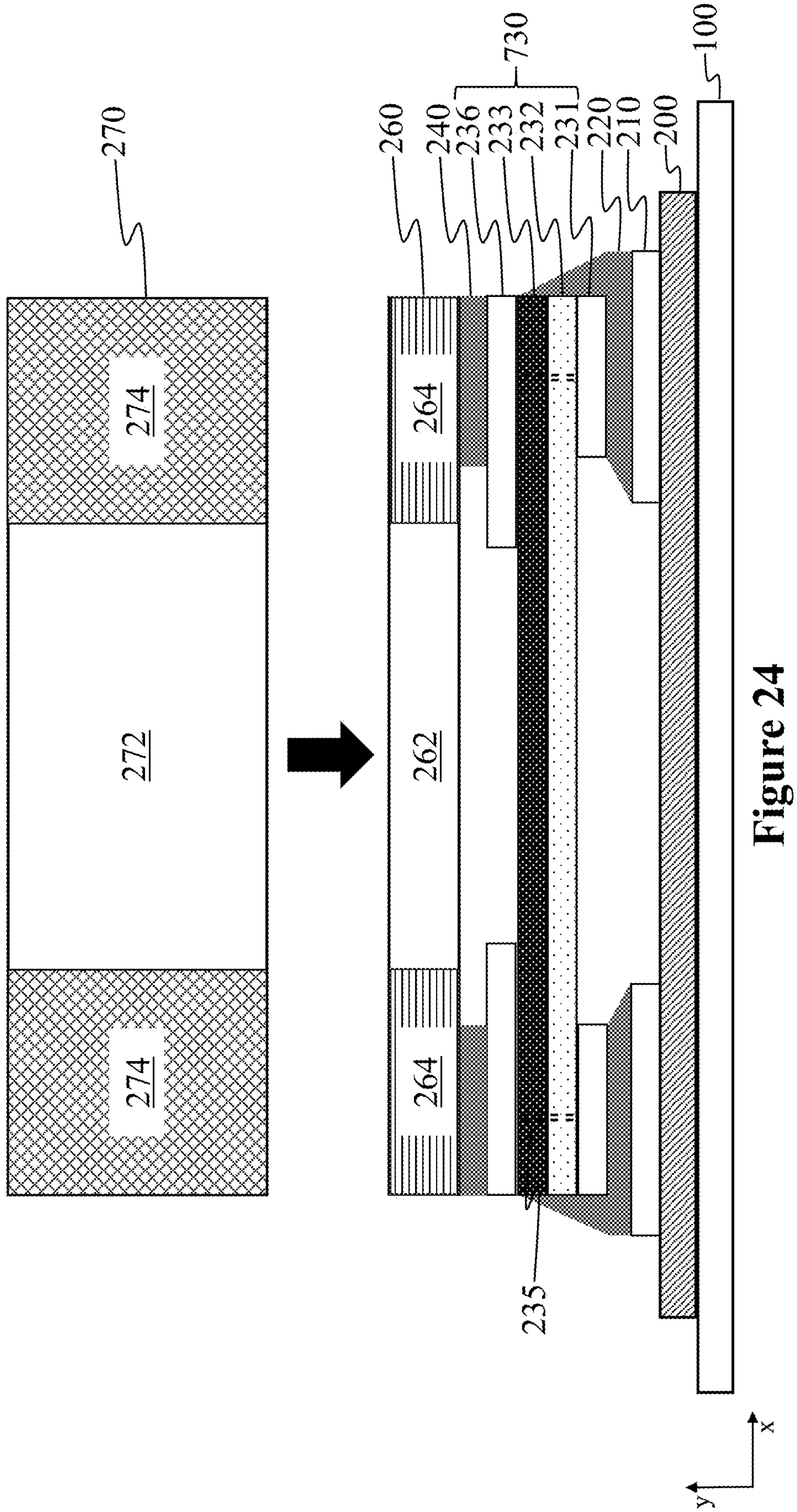

In operation 1830, a capacitor is disposed on the interposer with the damping structure. In some embodiments, operation 1830 is performed after operation 1820. Referring to FIG. 23, capacitor 270 is disposed on interposer 260 with damping structure 230, after substrate 200 is placed on printed circuit board 100. In a similar manner, referring to FIG. 24, capacitor 270 is disposed on interposer 260 with damping structure 730, after substrate 200 is placed on printed circuit board 100.

In some embodiments, capacitor 270 is placed on interposer 260 with damping structure 230 and interposer 260 with damping structure 730 using a surface mount assembly process, where capacitor 270 is one of multiple capacitors packaged into individual pockets of a carrier tape. The carrier tape can be loaded into component-placement equipment, where individual capacitors 270 are picked up from the carrier tape and placed into solder on interposer 260.

The present disclosure describes aspects of a damping structure. Specifically, the present disclosure describes a damping structure (e.g., damping structure 230 of FIG. 2 and damping structure 730 of FIG. 7) for a capacitor disposed on a substrate (or printed circuit board). For example, the capacitor (e.g., capacitor 270) can include a ceramic-based dielectric material, such as barium titanate. When an AC voltage is applied to the ceramic-based capacitor, the capacitor can start to vibrate due to piezoelectricity. Also, an electric field generated between electrodes of the ceramic-based capacitor can create an electrostrictive vibration at a level similar to the piezoelectric vibration level. As a result, the capacitor's piezoelectric and electrostrictive vibrations can be transferred to the substrate (e.g., substrate 200) or printed circuit board (e.g., printed circuit board 100), causing an undesirable resonance in the audible range (e.g., between about 20 Hz and 20 kHz) to be generated by the substrate or printed circuit board. Embodiments of the damping structure described herein are designed to mitigate (or eliminate) the transfer of the capacitor's piezoelectric and electrostrictive vibrations to the substrate or printed circuit board-thus, mitigating (or eliminating) the undesirable audible noise.

Figure 25:
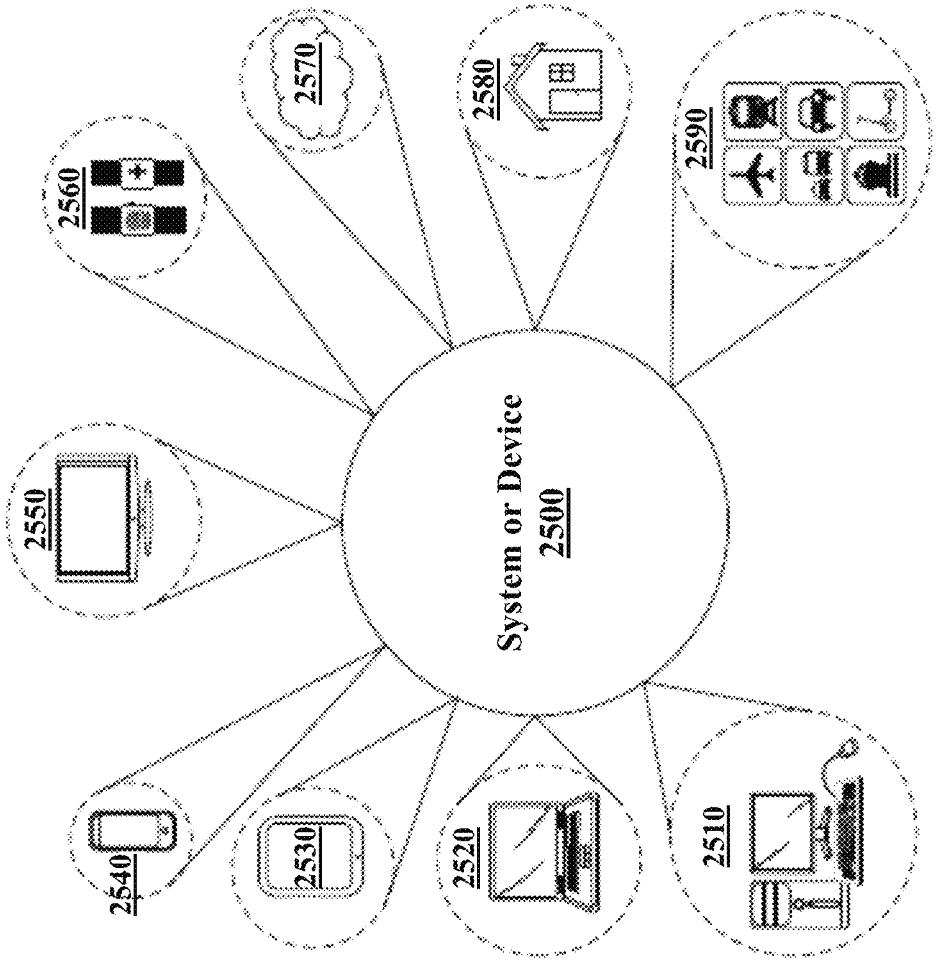
FIG. 25 is an illustration of various exemplary systems or devices that can include the disclosed embodiments.

FIG. 25 is an illustration of exemplary systems or devices that can include the disclosed embodiments. System or device 2500 can incorporate one or more of the disclosed embodiments-such as printed circuit board 100 of FIG. 1—in a wide range of areas. For example, system or device 2500 can be implemented in one or more of a desktop computer 2510, a laptop computer 2520, a tablet computer 2530, a cellular or mobile phone 2540, and a television 2550 (or a set-top box in communication with a television).

Also, system or device 2500 can be implemented in a wearable device 2560, such as a smartwatch or a health-monitoring device. In some embodiments, the smartwatch can have different functions, such as access to email, cellular service, and calendar functions. Wearable device 2560 can also perform health-monitoring functions, such as monitoring a user's vital signs and performing epidemiological functions (e.g., contact tracing and providing communication to an emergency medical service). Wearable device 2560 can be worn on a user's neck, implantable in user's body, glasses or a helmet designed to provide computer-generated reality experiences (e.g., augmented and/or virtual reality), any other suitable wearable device, and combinations thereof.

Further, system or device 2500 can be implemented in a server computer system, such as a dedicated server or on shared hardware that implements a cloud-based service 2570. System or device 2500 can be implemented in other electronic devices, such as a home electronic device 2580 that includes a refrigerator, a thermostat, a security camera, and other suitable home electronic devices. The interconnection of such devices can be referred to as the "Internet of Things" (IoT). System or device 2500 can also be implemented in various modes of transportation 2590, such as part of a vehicle's control system, guidance system, and/or entertainment system.

The systems and devices illustrated in FIG. 25 are merely examples and are not intended to limit future applications of the disclosed embodiments. Other example systems and devices that can implement the disclosed embodiments include portable gaming devices, music players, data storage devices, and unmanned aerial vehicles.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
a substrate;
a damping structure disposed over the substrate, wherein the damping structure comprises:
a rigid material layer; and
a damping material layer disposed on the rigid material layer and comprising a damping material with a tensile strength of about 20 MPa, a Young's modulus of about 0.5 GPa, and an elongation of about 10%; and
a capacitor structure disposed over the damping structure.

2. The structure of claim 1, wherein the substrate is a flame retardant 4 (FR4) printed circuit board.

3. The structure of claim 1, wherein the damping structure further comprises an other rigid material layer disposed on the damping material layer, and wherein the rigid material layer and the other rigid material layer comprise a same material.

4. The structure of claim 3, wherein the same material is a flame retardant 4 (FR4) material.

5. The structure of claim 3, wherein the damping structure further comprises a plurality of contact pads disposed on the other rigid material layer.

6. The structure of claim 1, wherein the damping structure further comprises a plurality of contact pads disposed on the damping material layer.

7. The structure of claim 1, wherein the damping structure further comprises a plurality of conductive structures disposed through the rigid material layer and the damping material layer.

8. The structure of claim 1, wherein the damping material has a coefficient of thermal expansion between about 90 ppm/° C. and about 170 ppm/° C., a dielectric constant of about 3, and a loss tangent of about 0.01.

9. The structure of claim 1, wherein the capacitor structure comprises:

a capacitor; and an interposer disposed on a bottom surface of the capacitor, wherein the interposer comprises a plurality of contact pad regions.

10. The structure of claim 9, wherein each contact pad region in the plurality of contact pad regions has a rectangular shape.

11. The structure of claim 9, wherein each contact pad region in the plurality of contact pad regions has a curved side surface.

12. A printed circuit board, comprising:

an electronic device surface;

a first plurality of contact pads disposed on the electronic device surface;

a solder layer disposed on the first plurality of contact pads;

a damping structure disposed on the solder layer, wherein the damping structure comprises:

a second plurality of contact pads disposed on the solder layer;

a rigid material layer disposed on the second plurality of contact pads; and a damping material layer disposed on the rigid material layer and comprising a damping material with a tensile strength of about 20 MPa, a Young's modulus of about 0.5 GPa, and an elongation of about 10%; and a capacitor structure disposed over the damping structure.

13. The printed circuit board of claim 12, wherein the solder layer is in contact with a side surface of the damping structure.

14. The printed circuit board of claim 12, wherein the damping structure further comprises an other rigid material layer disposed on the damping material layer.

15. The printed circuit board of claim 14, wherein the damping structure further comprises a plurality of contact pads disposed on the other rigid material layer and electrically connected to the capacitor structure.

16. The printed circuit board of claim 14, wherein the rigid material layer and the other rigid material layer have a thickness between about 30 μm and about 35 μm.

17. The printed circuit board of claim 12, wherein the damping structure further comprises a plurality of conductive structures disposed through the rigid material layer and the damping material layer, wherein the plurality of conductive structures are electrically connected to the second plurality of contact pads.

18. The printed circuit board of claim 12, wherein the damping structure further comprises a plurality of contact pads disposed on the damping material layer and electrically connected to the capacitor structure.

19. The printed circuit board of claim 12, wherein the damping material layer has a thickness between about 25 μm and about 40 μm.

20. The printed circuit board of claim 12, wherein the damping material has a coefficient of thermal expansion between about 90 ppm/° C. and about 170 ppm/° C., a dielectric constant of about 3, and a loss tangent of about 0.01.

21. The printed circuit board of claim 12, wherein the capacitor structure comprises:

a capacitor; and an interposer disposed on a bottom surface of the capacitor, wherein the interposer comprises a plurality of contact pad regions electrically connected to the damping structure via an other solder layer.

22. A method, comprising:

disposing, over a substrate, a damping structure comprising:

a rigid material layer; and a damping material layer on the rigid material layer, wherein the damping material layer comprises a damping material with a tensile strength of about 20 MPa, a Young's modulus of about 0.5 GPa, and an elongation of about 10%; and disposing a capacitor structure over the damping structure.

23. The method of claim 22, further comprising:

placing the substrate, with the damping structure and the capacitor structure disposed thereon, on a printed circuit board.

24. The method of claim 22, further comprising:

disposing a first plurality of contact pads on the substrate; and disposing a solder layer on the first plurality of contact pads.

25. The method of claim 24, wherein disposing the damping structure comprises disposing the damping structure on the solder layer.

26. The method of claim 22, further comprising:

disposing a solder layer on the damping structure.

27. The method of claim 26, wherein disposing the capacitor structure comprises disposing the capacitor structure on the solder layer.

28. The method of claim 22, wherein the damping structure further comprises an other rigid material layer on the damping material layer with a plurality of contact pads disposed thereon, and wherein the method further comprises:

disposing a solder layer on the plurality of contact pads.

29. The method of claim 28, wherein disposing the capacitor structure comprises disposing the capacitor structure on the solder layer.

30. The method of claim 22, wherein the damping material has a coefficient of thermal expansion between about 90 ppm/° C. and about 170 ppm/° C., a dielectric constant of about 3, and a loss tangent of about 0.01.

31. A method, comprising:

disposing an interposer with a damping structure on a substrate, wherein the damping structure comprises:

a rigid material layer; and a damping material layer on the rigid material layer, wherein the damping material layer comprises a damping material with a tensile strength of about 20 MPa, a Young's modulus of about 0.5 GPa, and an elongation of about 10%;

placing the substrate with the interposer and the damping structure on a printed circuit board; and disposing, after placing the substrate on the printed circuit board, a capacitor on the interposer with the damping structure.

32. The method of claim 31, further comprising:

disposing a first plurality of contact pads on the substrate; and disposing a solder layer on the first plurality of contact pads.

33. The method of claim 32, wherein disposing the interposer with the damping structure comprises disposing the damping structure on the solder layer.

34. The method of claim 31, wherein disposing the interposer with the damping structure comprises disposing a solder layer on the damping structure.

35. The method of claim 31, wherein the damping structure further comprises an other rigid material layer on the damping material layer with a plurality of contact pads disposed thereon, and wherein disposing the interposer with the damping structure comprises disposing the interposer over the plurality of contact pads.

36. The method of claim 31, wherein the damping material has a coefficient of thermal expansion between about 90 ppm/° C. and about 170 ppm/° C., a dielectric constant of about 3, and a loss tangent of about 0.01.

* * * * *